(12) United States Patent
Miyashita

(10) Patent No.: US 10,981,325 B2
(45) Date of Patent: Apr. 20, 2021

(54) MANUFACTURING METHOD FOR THREE-DIMENSIONAL OBJECT AND MANUFACTURING APPARATUS FOR THREE-DIMENSIONAL OBJECT

(71) Applicant: Seiko Epson Corporation, Tokyo (JP)

(72) Inventor: Takeshi Miyashita, Suwa (JP)

(73) Assignee: Seiko Epson Corporation

( * ) Notice: Subject to any disclaimer, the term of this patent is extended or adjusted under 35 U.S.C. 154(b) by 293 days.

(21) Appl. No.: 16/142,026

(22) Filed: Sep. 26, 2018

(65) Prior Publication Data
US 2019/0091922 A1 Mar. 28, 2019

(30) Foreign Application Priority Data
Sep. 27, 2017 (JP) .............................. JP2017-186926

(51) Int. Cl.
| | | |
|---|---|---|
| *B29C 64/153* | (2017.01) | |
| *B33Y 30/00* | (2015.01) | |
| *B33Y 50/02* | (2015.01) | |
| *B33Y 10/00* | (2015.01) | |
| *B29C 64/393* | (2017.01) | |
| *B29C 64/106* | (2017.01) | |
| *B29C 64/112* | (2017.01) | |
| *B29C 64/264* | (2017.01) | |
| *G06F 30/00* | (2020.01) | |

(52) U.S. Cl.
CPC .......... *B29C 64/153* (2017.08); *B29C 64/106* (2017.08); *B29C 64/112* (2017.08); *B29C 64/264* (2017.08); *B29C 64/393* (2017.08); *B33Y 10/00* (2014.12); *B33Y 30/00* (2014.12); *B33Y 50/02* (2014.12); *G06F 30/00* (2020.01)

(58) Field of Classification Search
None
See application file for complete search history.

(56) References Cited

U.S. PATENT DOCUMENTS

| | | | |
|---|---|---|---|
| 7,850,885 B2 | 12/2010 | Philippi et al. | |
| 2002/0129485 A1* | 9/2002 | Mok | G05B 19/4099 29/527.2 |
| 2016/0089720 A1* | 3/2016 | Kamakura | B22F 1/0062 419/53 |
| 2016/0271696 A1* | 9/2016 | Kamakura | B33Y 40/00 |
| 2019/0022756 A1* | 1/2019 | Ohnishi | B22F 3/24 |

FOREIGN PATENT DOCUMENTS

| | | |
|---|---|---|
| JP | 2004-009573 A | 1/2004 |
| JP | 2008-540173 A | 11/2008 |

* cited by examiner

*Primary Examiner* — Mary Lynn F Theisen
(74) *Attorney, Agent, or Firm* — Harness, Dickey & Pierce, P.L.C.

(57) ABSTRACT

Provided is a manufacturing method for a three-dimensional object, the method including: a layer formation process in which a layer is formed using a fluid material containing powder for constituting the three-dimensional object, a solvent, and a binder; and a laser radiation process in which the powder contained in the layer is solidified by radiating a laser to the layer. The laser radiation process controls a radiation position of the laser in an end portion of the layer with respect to a position of a leading end of the end portion of the layer in accordance with a shape of the three-dimensional object to be manufactured.

10 Claims, 24 Drawing Sheets

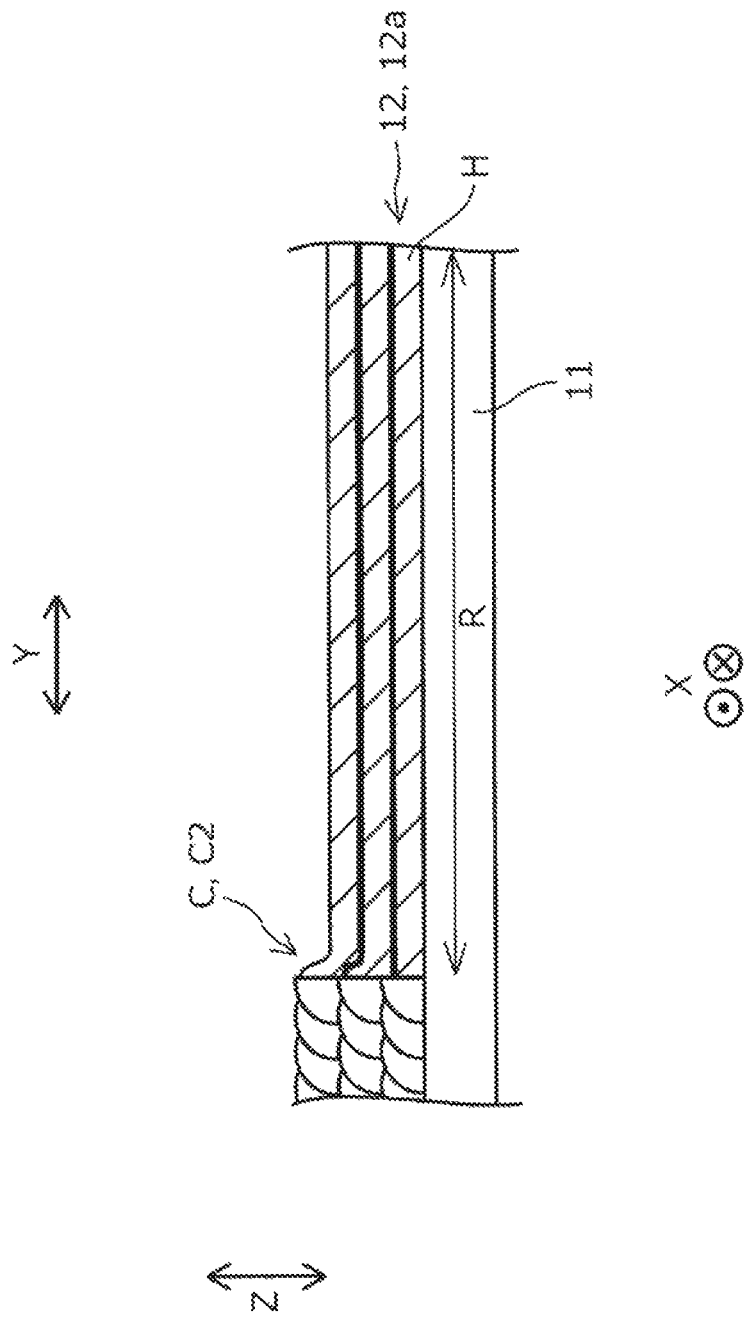

MANUFACTURING METHOD FOR THREE-DIMENSIONAL OBJECT AND MANUFACTURING APPARATUS FOR THREE-DIMENSIONAL OBJECT

This application claims priority under 35 U.S.C. § 119 to Japanese Patent Application No. 2017-186926 filed on Sep. 27, 2017, the entire disclosure of which is expressly incorporated by reference herein.

BACKGROUND

1. Technical Field

The present invention relates to a manufacturing method for a three-dimensional object and a manufacturing apparatus for a three-dimensional object.

2. Related Art

Manufacturing apparatuses of various configurations for manufacturing three-dimensional objects have been used. Among them, such a manufacturing apparatus for a three-dimensional object is used that manufactures a three-dimensional object by forming a layer and then radiating a laser to solidify the layer.

For example, JP-T-2008-540173 discloses a manufacturing apparatus for a three-dimensional object configured to manufacture a three-dimensional object by forming a layer of powder material and radiating a laser to the layer so as to solidify the stated layer.

Three-dimensional objects of various shapes are manufactured by manufacturing apparatuses for three-dimensional objects. However, with a manufacturing apparatus for a three-dimensional object configured to manufacture a three-dimensional object by performing the formation of a layer and the solidification of the layer using a laser, it is difficult to manufacture an end portion of the three-dimensional object with high precision. The reason for this is as follows: in the case where the layer is solidified by being irradiated with a laser, since the end portion is linearly solidified along a radiation direction of the laser, quality of the three-dimensional object is lowered unless the three-dimensional object is such an object that the end portion thereof is constituted of only a surface along the radiation direction of the laser (vertical surface). To be specific, in a case where, for example, there is a slope in an end portion of the three-dimensional object, not a smooth slope but an uneven slope where step-like vertical surfaces corresponding to each of the layers are continued is formed in the end portion of the three-dimensional object, thereby raising the above quality problem. Accordingly, with an existing manufacturing apparatus for a three-dimensional object configured to manufacture a three-dimensional object by performing the formation of layers and the solidification of the layers using a laser, it is difficult to manufacture a three-dimensional object with high quality.

SUMMARY

An advantage of some aspects of the invention is to manufacture a three-dimensional object with high quality.

A manufacturing method for a three-dimensional object according to an aspect of the invention in order to solve the above problem includes: forming a layer in which the layer is formed using a fluid material containing powder for constituting a three-dimensional object, a solvent, and a binder; and radiating a laser in which the powder contained in the layer is solidified by the laser being radiated. The radiating of the laser controls a radiation position of the laser in an end portion of the layer with respect to a position of a leading end of the end portion of the layer in accordance with a shape of the three-dimensional object to be manufactured.

In the case where a layer is formed using a fluid material, the layer extends outward more at a lower side than at an upper side due to the effect of gravity, so that a slope is formed in the end portion of the layer. According to this aspect, the layer is formed using a fluid material, and the laser radiation position in the end portion of the layer is controlled with respect to a leading end position of the end portion of the layer in accordance with the shape of the three-dimensional object to be manufactured. As such, the three-dimensional object can be manufactured while selecting a case of making use of a slope formed in the end portion of the layer or a case of not making use of a slope formed in the end portion of the layer, by adjusting the laser radiation position in accordance with the shape of the three-dimensional object to be manufactured. Accordingly, this makes it possible to manufacture a three-dimensional object with high quality.

It is preferable that the manufacturing method for the three-dimensional object be such that, in a case where an end portion of the three-dimensional object to be manufactured is a vertical surface, the radiating of the laser controls the laser radiation position in the end portion of the layer corresponding to the end portion of the three-dimensional object in such a manner as not to include the leading end of the end portion of the layer.

As such, in the case where the end portion of the three-dimensional object to be manufactured is a vertical surface, the laser radiation position in the end portion of the layer corresponding to the end portion of the three-dimensional object is so controlled as not to include the leading end of the end portion of the layer. As such, by making the vertical surface in the end portion of the three-dimensional object be a surface of the end portion of the layer along a laser radiation direction, unevenness in the vertical surface can be reduced. Accordingly, in the case where the end portion of the three-dimensional object to be manufactured is a vertical surface, the three-dimensional object with high quality can be manufactured.

It is preferable that the manufacturing method for the three-dimensional object be such that, in a case where an end portion of the three-dimensional object to be manufactured is a slope extending outward in the laser radiation direction, the radiating of the laser controls the laser radiation position in the end portion of the layer corresponding to the end portion of the three-dimensional object in such a manner as to include the leading end of the end portion of the layer.

As such, in the case where the end portion of the three-dimensional object to be manufactured is a slope extending outward in the laser radiation direction, the laser radiation position in the end portion of the layer corresponding to the end portion of the three-dimensional object is controlled to include the leading end of the end portion of the layer. In other words, in the case where the end portion of the three-dimensional object to be manufactured is a slope extending outward in the laser radiation direction, the three-dimensional object can be manufactured by making use of the slope of the layer accompanied by the formation of the layer using a fluid material. Accordingly, in the case where the end portion of the three-dimensional object to be manufactured is a slope extending outward in the laser radiation direction, the three-dimensional object with high quality can be manufactured.

It is preferable that the manufacturing method for the three-dimensional object be such that the forming of the layer is performed to form a layer using, in addition to the fluid material, a support material with fluidity for supporting the fluid material at an end portion of the layer of the fluid material, and the radiating of the laser, in a case where the end portion of the three-dimensional object to be manufactured is a slope extending inward in the laser radiation direction, controls the laser radiation position in the end portion of the layer of the fluid material corresponding to the end portion of the three-dimensional object in such a manner as to include the leading end of the end portion of the layer of the fluid material.

As such, a layer can be formed using the support material with fluidity while making use of a slope in the end portion of the support material with fluidity, and it is possible to form a slope of the fluid material extending inward in the laser radiation direction by making use of the above-mentioned slope. Then, the three-dimensional object can be manufactured making use of the slope of the fluid material. Accordingly, in the case where the end portion of the three-dimensional object to be manufactured is a slope extending inward in the laser radiation direction, the three-dimensional object with high quality can be manufactured.

It is preferable that the manufacturing method for the three-dimensional object be such that the forming of the layer is performed to form the above-mentioned layer by discharging the fluid material in a droplet state.

As such, since the layer is formed by the fluid material being discharged in the droplet state, the layer to form the three-dimensional object can be formed with precision.

It is preferable that the manufacturing method for the three-dimensional object be such that precision in the radiation position of the laser is higher than precision in an arrangement position of the droplet.

As such, the precision in the radiation position of the laser is higher than the precision in the arrangement position of the droplet. This makes it possible to precisely solidify the three-dimensional object and consequently to manufacture the three-dimensional object large in size and excellent in quality.

It is preferable that the manufacturing method for the three-dimensional object be such that the three-dimensional object is manufactured by laminating the layers, by repeating the forming of the layer and the radiating of the laser.

As such, since the three-dimensional object is manufactured by laminating the layers by repeating the forming of the layer and the radiating of the laser, the three-dimensional object with high quality can be manufactured by laminating the layers.

It is preferable that the manufacturing method for the three-dimensional object be such that, in a case where an end portion of the three-dimensional object to be manufactured is a vertical surface, the end portion of the three-dimensional object is caused to correspond to an end portion of each of the layers prepared in the forming of the layer, and an arrangement position of the fluid material in the end portion of each of the layers corresponding to the end portion of the three-dimensional object is aligned in each of the forming of the layer.

As such, in the case where the end portion of the three-dimensional object to be manufactured is a vertical surface, the end portion of the three-dimensional object is caused to correspond to the end portion of each of the layers prepared in the forming of the layer, and the arrangement position of the fluid material in the end portion of each of the layers corresponding to the end portion of the three-dimensional object is aligned in each of the forming of the layer. This makes it possible for an excessive fluid material to retreat from the end portion of the layer toward the outside of the layer in each of the forming of the layer, and consequently makes it possible to suppress a situation in which a projection or the like is generated in the end portion of the three-dimensional object (a problem of a decrease in quality of the three-dimensional object).

A manufacturing apparatus for a three-dimensional object according to another aspect of the invention includes: a layer forming unit configured to form a layer using a fluid material containing powder for constituting a three-dimensional object, a solvent, and a binder; a laser radiator configured to radiate a laser to the layer so as to solidify the powder contained in the layer; and a control unit configured to control a radiation position of the laser in an end portion of the layer with respect to a leading end position of the end portion of the layer in accordance with a shape of the three-dimensional object to be manufactured.

In the case where the layer is formed using a fluid material, the layer extends outward more at a lower side than at an upper side due to the effect of gravity, so that a slope is formed in the end portion of the layer. According to this aspect, the layer is formed using a fluid material, and the laser radiation position in the end portion of the layer is controlled with respect to a leading end position of the end portion of the layer in accordance with the shape of the three-dimensional object to be manufactured. As such, the three-dimensional object can be manufactured while selecting a case of making use of a slope formed in the end portion of the layer or a case of not making use of a slope formed in the end portion of the layer, by adjusting the laser radiation position in accordance with the shape of the three-dimensional object to be manufactured. Accordingly, this makes it possible to manufacture a three-dimensional object with high quality.

It is preferable that the manufacturing apparatus for the three-dimensional object be such that the control unit determines whether an end portion of the three-dimensional object to be manufactured is a vertical surface or a slope. In a case where it is determined that the end portion of the three-dimensional object to be manufactured is a vertical surface, the control unit controls the laser radiation position in the end portion of the layer corresponding to the end portion of the three-dimensional object in such a manner as not to include a leading end of the end portion of the layer. In a case where it is determined that the end portion of the three-dimensional object to be manufactured is a slope, the control unit controls the laser radiation position in the end portion of the layer corresponding to the end portion of the three-dimensional object in such a manner as to include a leading end of the end portion of the layer.

As such, in the case where the end portion of the three-dimensional object to be manufactured is a vertical surface, the laser radiation position in the end portion of the layer corresponding to the end portion of the three-dimensional object is so controlled as not to include the leading end of the end portion of the layer; in the case where the end portion of the three-dimensional object to be manufactured is a slope, the laser radiation position in the end portion of the layer corresponding to the end portion of the three-dimensional object is so controlled as to include the leading end of the end portion of the layer. This makes it possible to manufacture a three-dimensional object with high quality in both the cases where the end portion of the three-dimensional object to be manufactured is a vertical surface and where the stated end portion is a slope.

BRIEF DESCRIPTION OF THE DRAWINGS

The invention will be described with reference to the accompanying drawings, wherein like numbers reference like elements.

FIG. 24 is a schematic diagram for describing an example of manufacturing in a case of manufacturing a three-dimensional object using a three-dimensional object manufacturing apparatus according to an embodiment of the invention.

DESCRIPTION OF EXEMPLARY EMBODIMENTS

Hereinafter, embodiments according to the invention will be described with reference to the drawings.

First, a manufacturing apparatus 1 for a three-dimensional object O according to an embodiment of the invention will be described.

Figure 1:
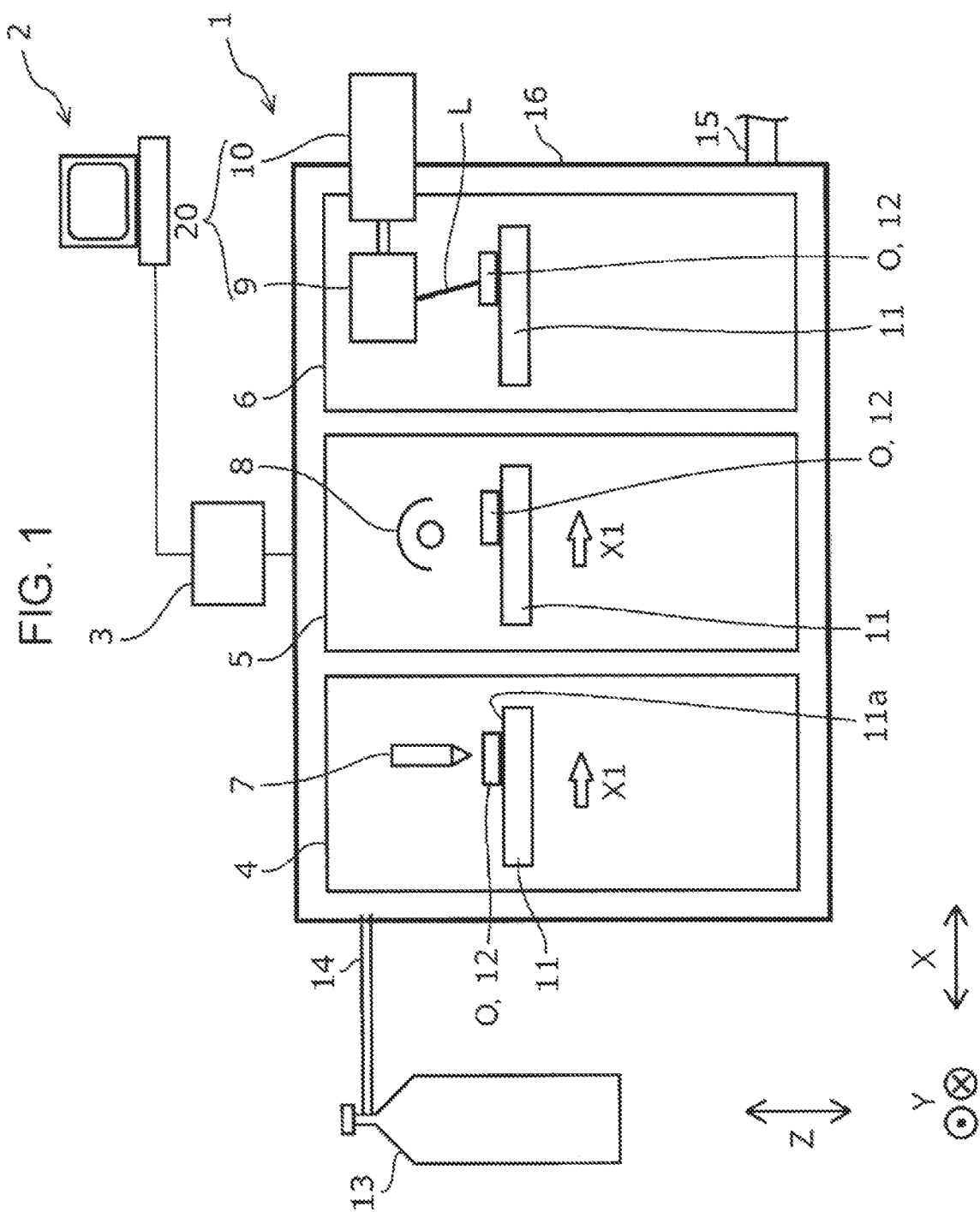
FIG. 1 is a configuration diagram schematically illustrating the configuration of a manufacturing apparatus for a three-dimensional object (hereinafter, also referred to as a "three-dimensional object manufacturing apparatus") according to an embodiment of the invention.

FIG. 1 is a configuration diagram schematically illustrating the configuration of the manufacturing apparatus 1 for the three-dimensional object O according to the present embodiment.

The manufacturing apparatus 1 for the three-dimensional object O according to the present embodiment is a manufacturing apparatus for the three-dimensional object O configured to manufacture the three-dimensional object O by laminating a layer 12. As illustrated in FIG. 1, the manufacturing apparatus 1 for the three-dimensional object O according to the present embodiment includes an ejector 7, an object platform 11, a dryer 8 and a laser radiator 20, which will be explained later, and a control unit 3 for controlling the drive and movement of these constituent elements. Further, the manufacturing apparatus 1 for the three-dimensional object O according to the present embodiment includes, as illustrated in FIG. 1, a housing unit 16 inside which a sealed space is prepared, a gas tube 14 through which a nitrogen gas can be introduced into the housing unit 16 from a cylinder 13, and a gas tube 15 for discharging gas present inside the housing unit 16.

The ejector 7 of the present embodiment is configured to be capable of ejecting (discharging) a fluid material containing powder for constituting the three-dimensional object O, a solvent, and a binder, in a droplet state. Further, the ejector 7 of the present embodiment is configured to be also capable of ejecting (discharging), in addition to the above-mentioned fluid material, a support material with fluidity in a droplet state in order to support the above fluid material at an end portion of the layer 12 as needed.

As illustrated in FIG. 1, the ejector 7 of the present embodiment is formed in an ejection unit 4. Further, the ejector 7 of the present embodiment is configured to be capable of discharging the fluid material and the support material while moving in a direction Y intersecting with a direction X in which the object platform 11 to be explained later moves, and is also configured to be capable of adjusting a gap with respect to the object platform 11 because of being configured to be capable of moving along a direction Z, which is a vertical direction.

The object platform 11 of the present embodiment can move along the direction X, and the layer 12 is formed on an object face 11a with the fluid material ejected from the ejector 7. Here, the object platform 11 can move, by moving in a direction X1 of the direction X, from the ejection unit 4 to a drying unit 5 and further to a laser unit 6, which will be explained later. In addition, the object platform 11 can also move in an opposite direction to the direction X1 of the direction X; that is, after having finished the formation of the layer 12 in the ejection unit 4, the drying of the layer 12 in the drying unit 5, and the laser radiation to the layer 12 (sintering or melting) in the laser unit 6, the object platform 11 can return to the ejection unit 4 again to form a subsequent layer 12.

The dryer 8 of the present embodiment is configured to be capable of drying the layer 12 by volatilizing the solvent contained in the layer 12 formed on the object platform 11. Note that the dryer 8 of the present embodiment is a line heater provided along the direction Y, and is configured to be capable of drying the layer 12 by radiating infrared light onto the layer 12 formed on the object platform 11. However, the dryer 8 is not limited to the above configuration; the dryer 8 may be a dryer other than a line heater, or may have a configuration other than the configuration radiating electromagnetic waves such as infrared light. As illustrated in FIG. 1, the dryer 8 of the present embodiment is formed in the drying unit 5.

The laser radiator 20 of the present embodiment is constituted of a laser generator 10 and a galvanometer mirror 9. The galvanometer mirror 9 is so configured as to be capable of changing arrangement of a mirror (not illustrated) provided inside within a range of a predetermined angle and capable of moving along the direction Z. This configuration makes it possible to keep a laser L in focus continuously even when the layers 12 are laminated, and possible to radiate the laser L across the whole range of the object face 11a. As illustrated in FIG. 1, the laser radiator 20 of the present embodiment is formed in the laser unit 6.

Here, the direction X and the direction Y are a horizontal direction, while the direction Z is a vertical direction. As illustrated in FIG. 1, the manufacturing apparatus 1 for the three-dimensional object O according to the present embodiment disposes the object platform 11 so that the object face 11a extends in the horizontal direction in any of the following cases: a case in which the fluid material is ejected from the ejector 7 to form the layer 12 on the object face 11a, a case in which the infrared light is radiated from the dryer 8 to dry the layer 12, and a case in which the laser L is radiated from the laser radiator 20 to solidify (sinter or melt) the layer 12.

Next, the fluid material that can be used in the manufacturing apparatus 1 for the three-dimensional object O according to the present embodiment will be described in detail below.

As for an ingredient material (powder) of the three-dimensional object O, for example, a single powder of magnesium (Mg), iron (Fe), cobalt (Co), chrome (Cr), aluminum (Al), titanium (Ti), copper (Cu) or nickel (Ni), or a mixed powder of an alloy containing at least one of the above metals (maraging steel, stainless steel (SUS), cobalt chrome molybdenum, titanium alloy, nickel alloy, aluminum alloy, cobalt alloy, or cobalt chrome alloy) or the like is processed into a mixed material in a paste state containing a solvent and a binder; this mixed material can be used as the above-mentioned ingredient material. Further, a general engineering plastic such as polyamide, polyacetal, polycarbonate, modified-Polyphenyleneether, polybutylene terephthalate, or polyethylene terephthalate can be used. In addition, an engineering plastic (resin) such as polysulfone, polyether sulfone, polyphenylene sulphide, polyarylate, polyimide, polyamidoimide, polyether imide, or polyether ether ketone can also be used.

As described above, the ingredient material of the three-dimensional object O is not limited to any specific one, and metals other than the above-cited metals, ceramics, resins, or the like can also be used. Further, silicon dioxide, titanium dioxide, aluminum oxide, zirconium oxide, or the like can be preferably used.

Furthermore, fiber such as cellulose can also be used.

As a solvent, the following can be cited, for example: water; (poly)alkylene glycol monoalkyl ethers such as ethylene glycol monomethyl ether, ethylene glycol mono-ethyl ether, propylene glycol monomethyl ether, and propylene glycol mono-ethyl ether; acetic esters such as ethyl acetate, n-propyl acetate, iso-propyl acetate, n-butyl acetate, and iso-butyl acetate; aromatic hydrocarbons such as benzene, toluene, and xylene; ketones such as ethyl methyl ketone, acetone, methyl iso-butyl ketone, ethyl-n-butyl ketone, diisopropyl ketone, and acetylacetone; alcohols such as ethanol, propanol, and butanol; tetraalkylammonium acetates; sulfoxide-based solvents such as dimethyl sulfoxide and diethyl sulfoxide; pyridine-based solvents such as pyridine, γ-picoline, and 2,6-lutidine; and ionic liquids such as tetraalkylammonium acetate (e.g., tetrabutylammonium acetate or the like). One type of solvent selected from the above-cited solvents can be used, or two or more types of solvents selected from the above-cited solvents can be combined and used.

As a binder, the following can be cited, for example: an acryl resin, an epoxy resin, a silicone resin, a cellulose-based resin, or another synthetic resin; or polylactic acid (PLA), polyamide (PA), polyphenylene sulfide (PPS) or another thermoplastic resin.

Physical properties of the fluid material that can be used in the manufacturing apparatus 1 for the three-dimensional object O according to the present embodiment are not limited to any specific ones; that is, the fluid material is not limited to a liquid, and may be a material in a gel state as long as the material deforms due to the effect of gravity (the lower side extends outward more than the upper side) when the fluid material is mounted on a horizontal surface. Note that a fluid material with its viscosity being no less than 500 mPa·s and no more than 100000 mPa·s in a low shear rate region can be preferably used in particular.

An example of manufacturing in a case of manufacturing the three-dimensional object O using the manufacturing apparatus 1 for the three-dimensional object O according to the present embodiment will be described next with reference to FIGS. 2 to 12.

Of FIGS. 2 to 12, FIGS. 2 to 5 are diagrams for describing an example of manufacturing in a case where an end portion of the three-dimensional object O to be manufactured is a vertical surface. Meanwhile, FIG. 2 and FIGS. 6 to 8 are diagrams for describing an example of manufacturing in a case where the end portion of the three-dimensional object O to be manufactured is a slope extending outward in the radiation direction of the laser L (toward a lower side of the vertical direction, the slope extends outward). FIGS. 9 to 12 are diagrams for describing an example of manufacturing in a case where the end portion of the three-dimensional object O to be manufactured is a slope extending inward in the radiation direction of the laser L (toward the lower side of the vertical direction, the slope extends inward).

Although the above manufacturing examples are examples of manufacturing the three-dimensional object O constituted of the layers 12 laminated in three layers, the three-dimensional object O may be constituted of a single layer, two layers, or no less than four layers.

In the following description, a shape in which the shape of the end portion of the three-dimensional object O extends outward in the radiation direction of the laser L is referred to as a tapered shape, and a shape in which the shape of the end portion of the three-dimensional object O extends inward in the radiation direction of the laser is referred to as a reverse-tapered shape.

Figure 2:
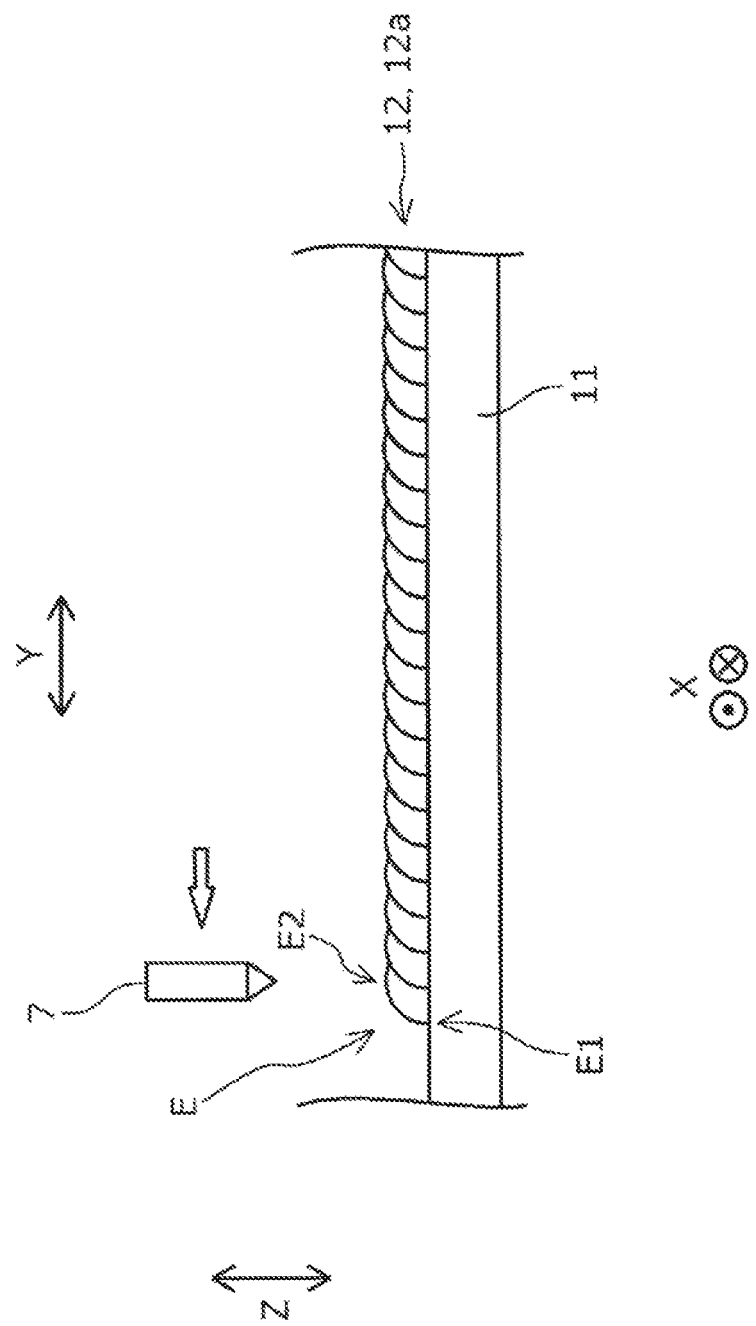
FIG. 2 is a schematic diagram for describing an example of manufacturing in a case of manufacturing a three-dimensional object using a three-dimensional object manufacturing apparatus according to an embodiment of the invention.

First, the case in which the end portion of the three-dimensional object O to be manufactured is a vertical surface will be described. In the case where the end portion of the three-dimensional object O to be manufactured is a vertical surface, one layer of the layer 12 is formed first by ejecting a fluid material from the ejector 7 (layer formation process), as illustrated in FIG. 2. Here, an end portion E of the layer 12 corresponds to the end portion of the three-dimensional object O. Here, FIG. 2 illustrates a state immediately after when a droplet of the fluid material corresponding to the end portion E of the layer 12 has been landed on the object platform 11, and also illustrates a state immediately after when one layer of a layer 12a constituted with the fluid material has been formed.

An outline arrow in FIG. 2 represents a movement direction of the ejector 7 when one layer of the layer 12 is formed.

Figure 3:
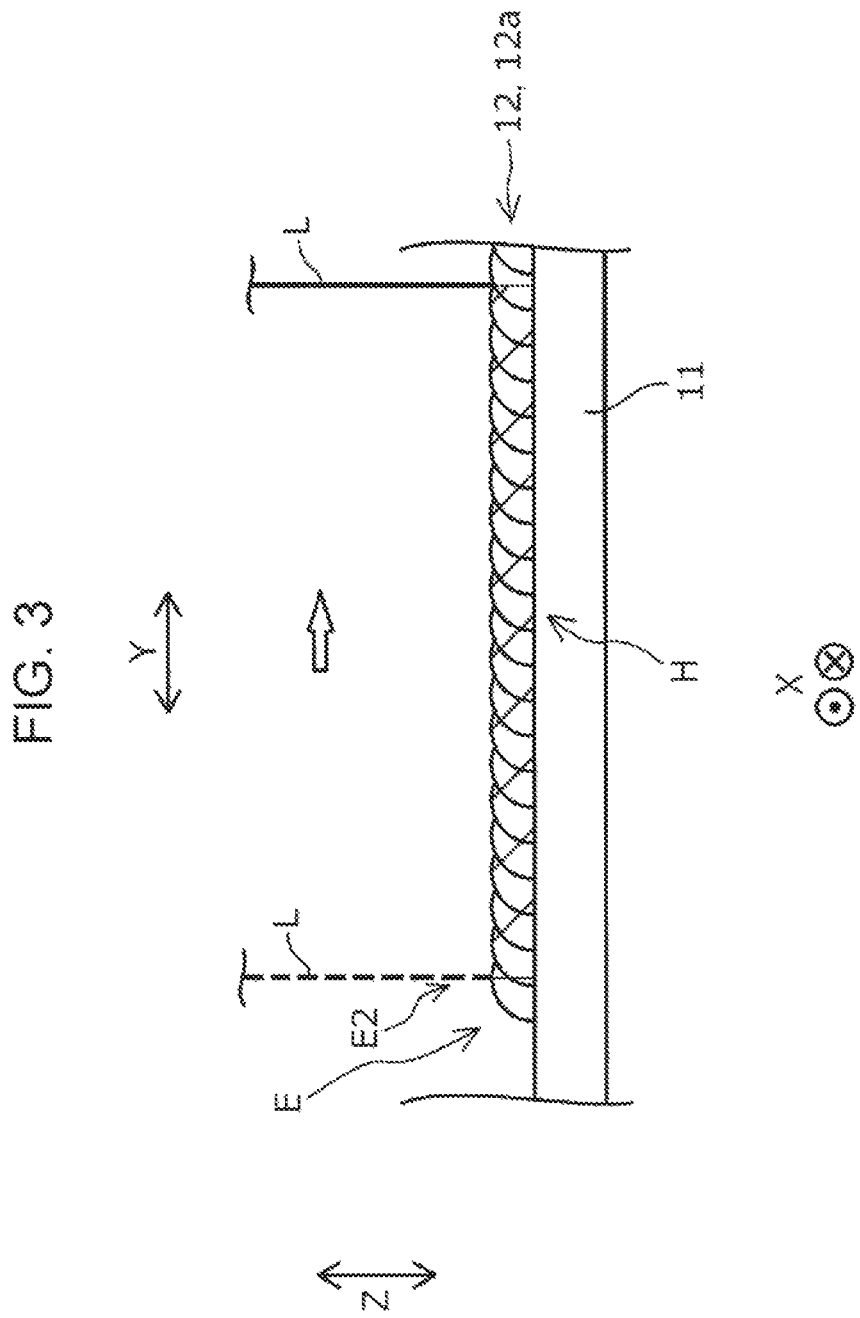
FIG. 3 is a schematic diagram for describing an example of manufacturing in a case of manufacturing a three-dimensional object using a three-dimensional object manufacturing apparatus according to an embodiment of the invention.

Next, as illustrated in FIG. 3, the laser L is radiated from the laser radiator 20 to one layer of the layer 12a constituted with the fluid material so as to solidify (melt or sinter) the stated one layer of the layer 12a constituted with the fluid material, thereby forming a solidified section H (laser radiation process). At this time, a radiation position of the laser L (radiation start position) with respect to the end portion E of the layer 12 corresponding to the end portion of the three-dimensional object O is not a leading end E1 of the end portion E of the layer 12, but a position E2 on an inner side of the layer 12 relative to the leading end E1. To be specific, the position E2 is a center portion of the droplet discharged from the ejector 7 to constitute the end portion E of the layer 12. By setting the radiation position of the laser L in this manner, it is attempted not to be influenced by a tapered shape of the leading end E1 of the end portion E of the layer 12 (it is attempted not to use a portion of a slope being thinned toward the outside).

An outline arrow in FIG. 3 represents a movement direction of the laser L radiated from the laser radiator 20.

Figure 4:
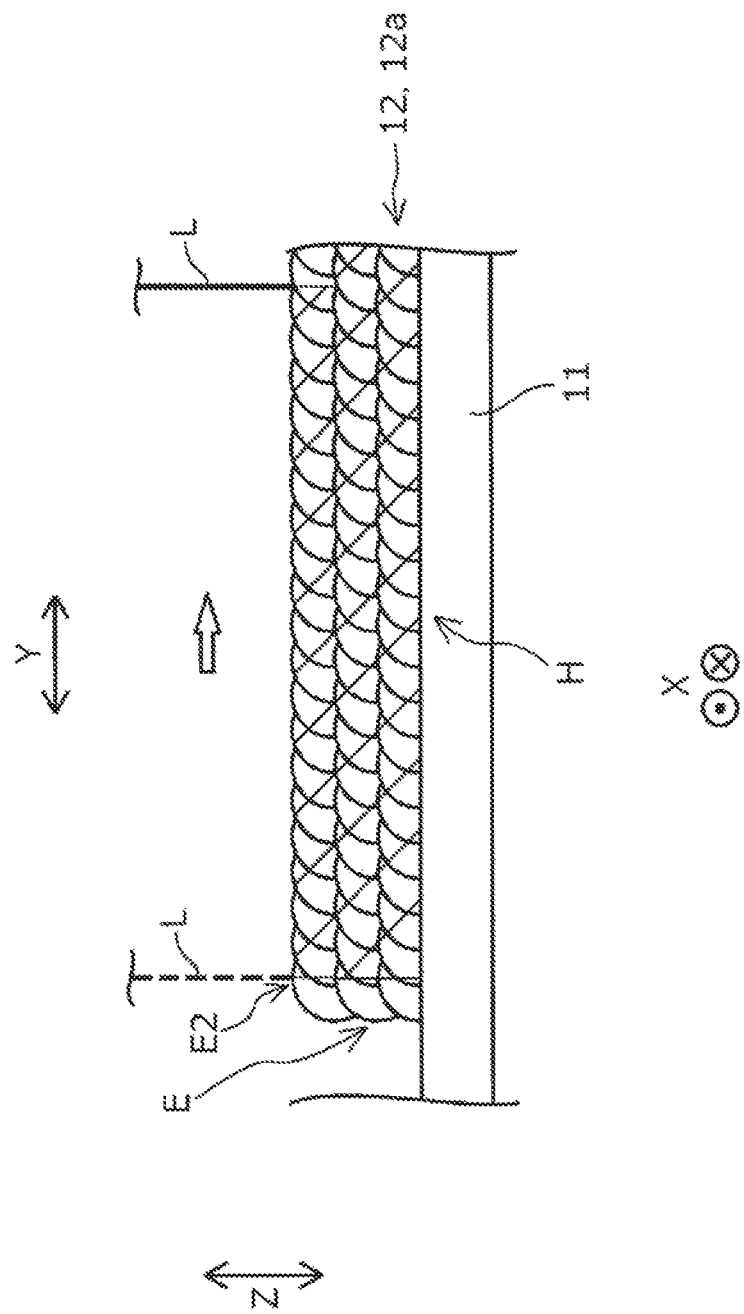
FIG. 4 is a schematic diagram for describing an example of manufacturing in a case of manufacturing a three-dimensional object using a three-dimensional object manufacturing apparatus according to an embodiment of the invention.
Figure 5:
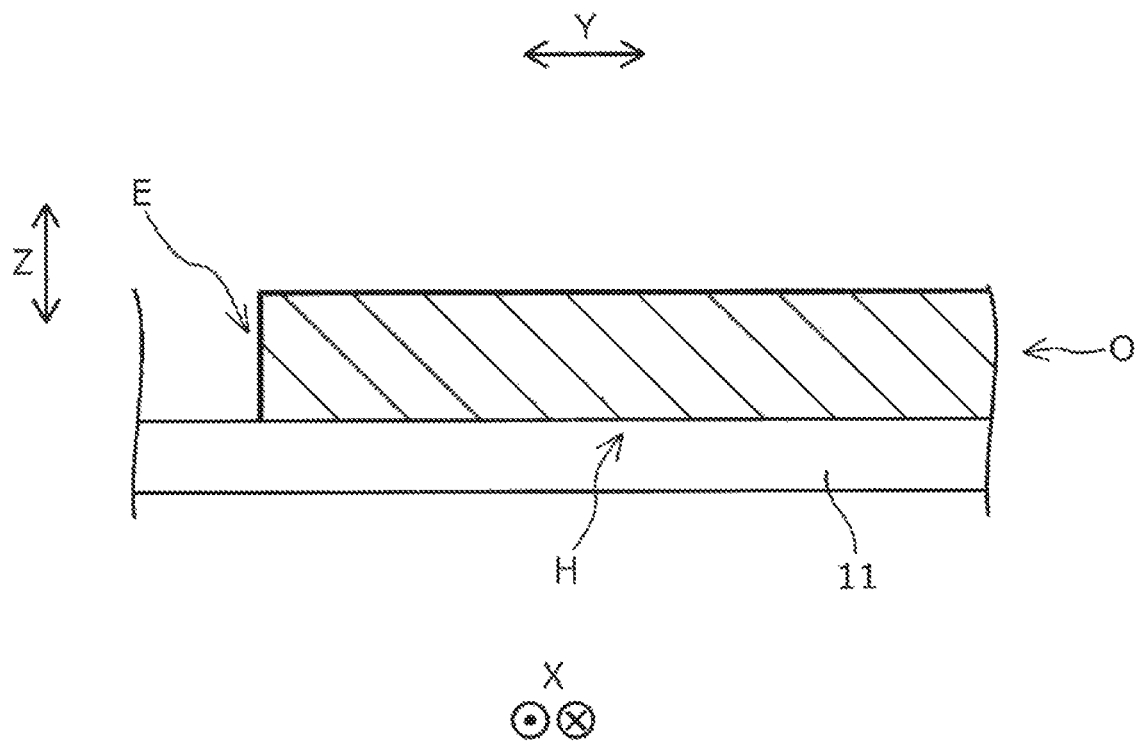
FIG. 5 is a schematic diagram for describing an example of manufacturing in a case of manufacturing a three-dimensional object using a three-dimensional object manufacturing apparatus according to an embodiment of the invention.

By repeating the layer formation process and the laser radiation process as discussed above, three layers of the layers 12a constituted with the fluid material are formed as illustrated in FIG. 4. Then, a laminated body of the three-dimensional object O formed as discussed above experiences cleaning with alcohol or the like, or experiences simple blast processing (removal of the fluid material not solidified in the periphery of the end portion E of the layer 12), whereby the three-dimensional object O is completed as illustrated in FIG. 5. By manufacturing the three-dimensional object O in this manner, the three-dimensional object O whose end portion (the end portion E of the layer 12) is a vertical surface with a high level of flatness can be formed, as illustrated in FIG. 5.

Next, the case in which the end portion of the three-dimensional object O to be manufactured is tapered will be described.

In the case where the end portion of the three-dimensional object O to be manufactured is tapered, one layer of the layer 12 is formed first by the fluid material being ejected from the ejector 7 as illustrated in FIG. 2 (layer formation process), like in the case where the end portion of the three-dimensional object O to be manufactured is a vertical surface. Further, like in the case where the end portion of the three-dimensional object O to be manufactured is a vertical surface, the end portion E of the layer 12 corresponds to the end portion of the three-dimensional object O.

Figure 6:
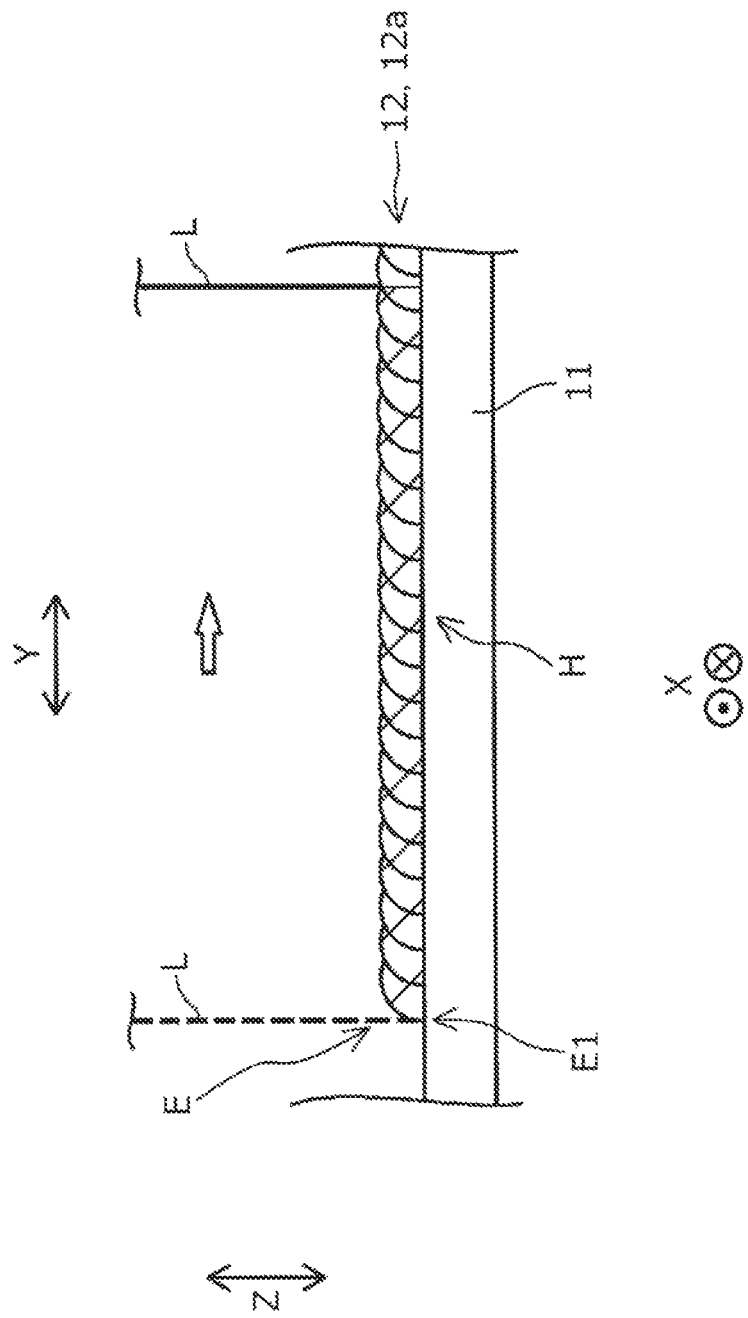
FIG. 6 is a schematic diagram for describing an example of manufacturing in a case of manufacturing a three-dimensional object using a three-dimensional object manufacturing apparatus according to an embodiment of the invention.

Next, as illustrated in FIG. 6, the laser L is radiated from the laser radiator 20 to one layer of the layer 12a constituted with the fluid material so as to solidify (melt or sinter) the stated one layer of the layer 12a constituted with the fluid material, thereby forming the solidified section H (laser radiation process). At this time, a radiation position of the laser L (radiation start position) with respect to the end portion E of the layer 12 corresponding to the end portion of the three-dimensional object O is the leading end E1 of the end portion E of the layer 12. As illustrated in FIG. 6, the vicinity of the leading end E1 of the end portion E of the layer 12 is formed in a tapered shape. This is because a slope is formed by the fluid material being extended outward more at the lower side than at the upper side due to the effect of gravity. By making use of the tapered shape of this portion, the tapered shape of the end portion of the three-dimensional object O can be formed with high quality.

Figure 7:
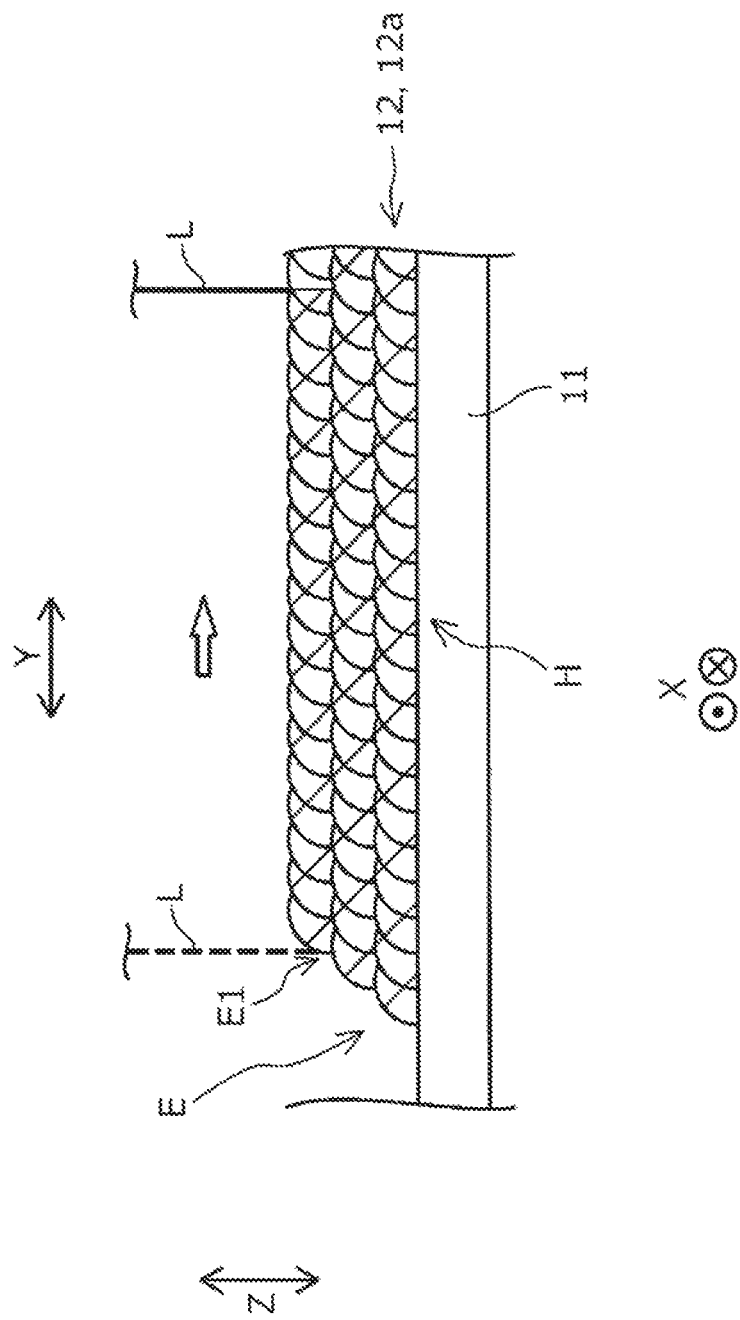
FIG. 7 is a schematic diagram for describing an example of manufacturing in a case of manufacturing a three-dimensional object using a three-dimensional object manufacturing apparatus according to an embodiment of the invention.
Figure 8:
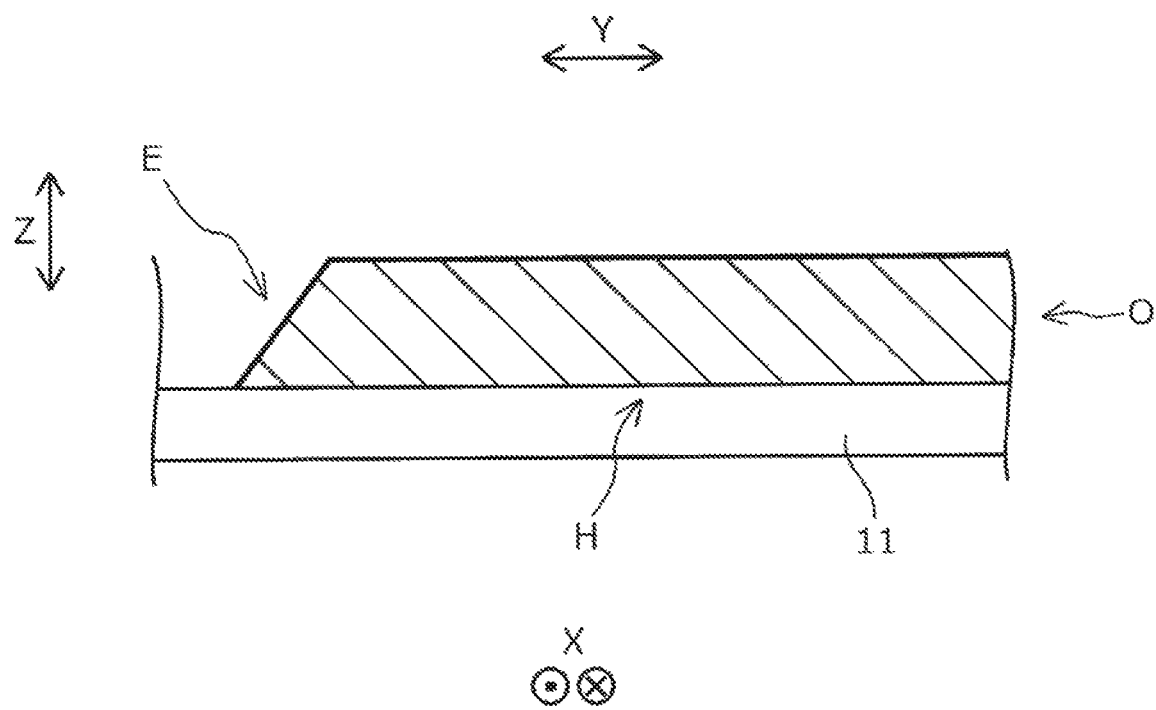
FIG. 8 is a schematic diagram for describing an example of manufacturing in a case of manufacturing a three-dimensional object using a three-dimensional object manufacturing apparatus according to an embodiment of the invention.

By repeating the layer formation process and the laser radiation process as discussed above, three layers of the layers 12a constituted with the fluid material are formed, as illustrated in FIG. 7. Then, a laminated body of the three-dimensional object O formed as discussed above experiences cleaning with alcohol or the like, or experiences simple blast processing, whereby the three-dimensional object O is completed as illustrated in FIG. 8. By manufacturing the three-dimensional object O in this manner, the three-dimensional object O whose end portion (the end portion E of the layer 12) exhibits a tapered shape with high quality can be formed, as illustrated in FIG. 8.

In the case where the end portion of the three-dimensional object O to be manufactured is tapered, if the radiation position of the laser L with respect to the end portion E of the layer 12 is set to the position E2 on the inner side of the layer 12 relative to the leading end E1 in the laser radiation process, as illustrated in FIG. 3, a vertical surface is formed in each of the three layers 12. As a result, the end portion of the three-dimensional object O is stepped, thereby the three-dimensional object O being manufactured without exhibiting a high-quality tapered shape.

Next, the case in which the end portion of the three-dimensional object O to be manufactured is reverse-tapered will be described.

Figure 9:
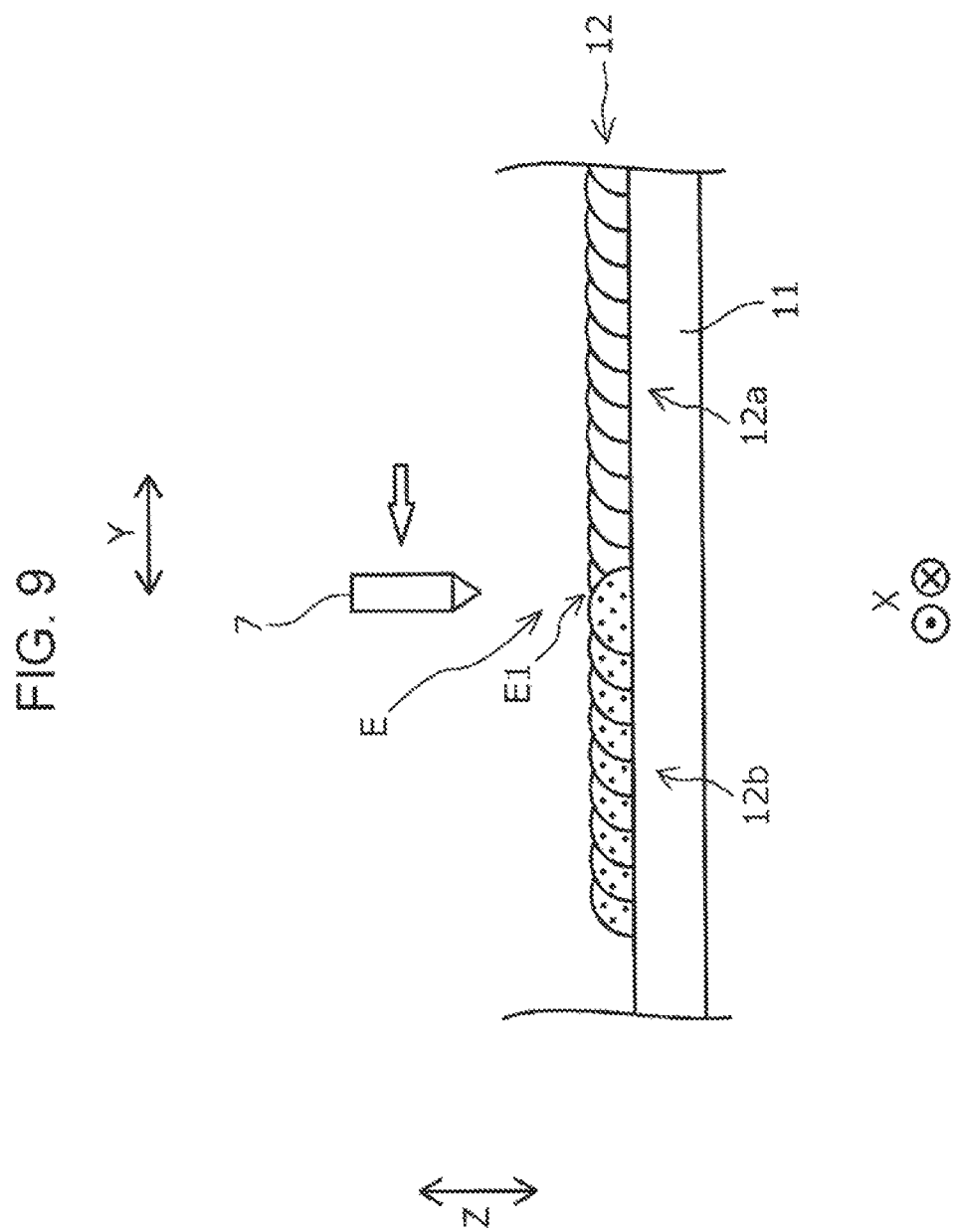
FIG. 9 is a schematic diagram for describing an example of manufacturing in a case of manufacturing a three-dimensional object using a three-dimensional object manufacturing apparatus according to an embodiment of the invention.

In the case where the end portion of the three-dimensional object O to be manufactured is reverse-tapered, firstly, the support material and the fluid material are ejected from the ejector 7 to form one layer of the layer 12 constituted of a layer 12b of the support material and a layer 12a of the fluid material (layer formation process), as illustrated in FIG. 9. Here, since the layer 12b of the support material is formed first, and thereafter the layer 12a of the fluid material is formed, an end portion E of the layer 12a of the fluid material is formed in a reverse-tapered shape, as illustrated in FIG. 9. Note that the end portion E of the layer 12a of the fluid material corresponds to the end portion of the three-dimensional object O.

Figure 10:
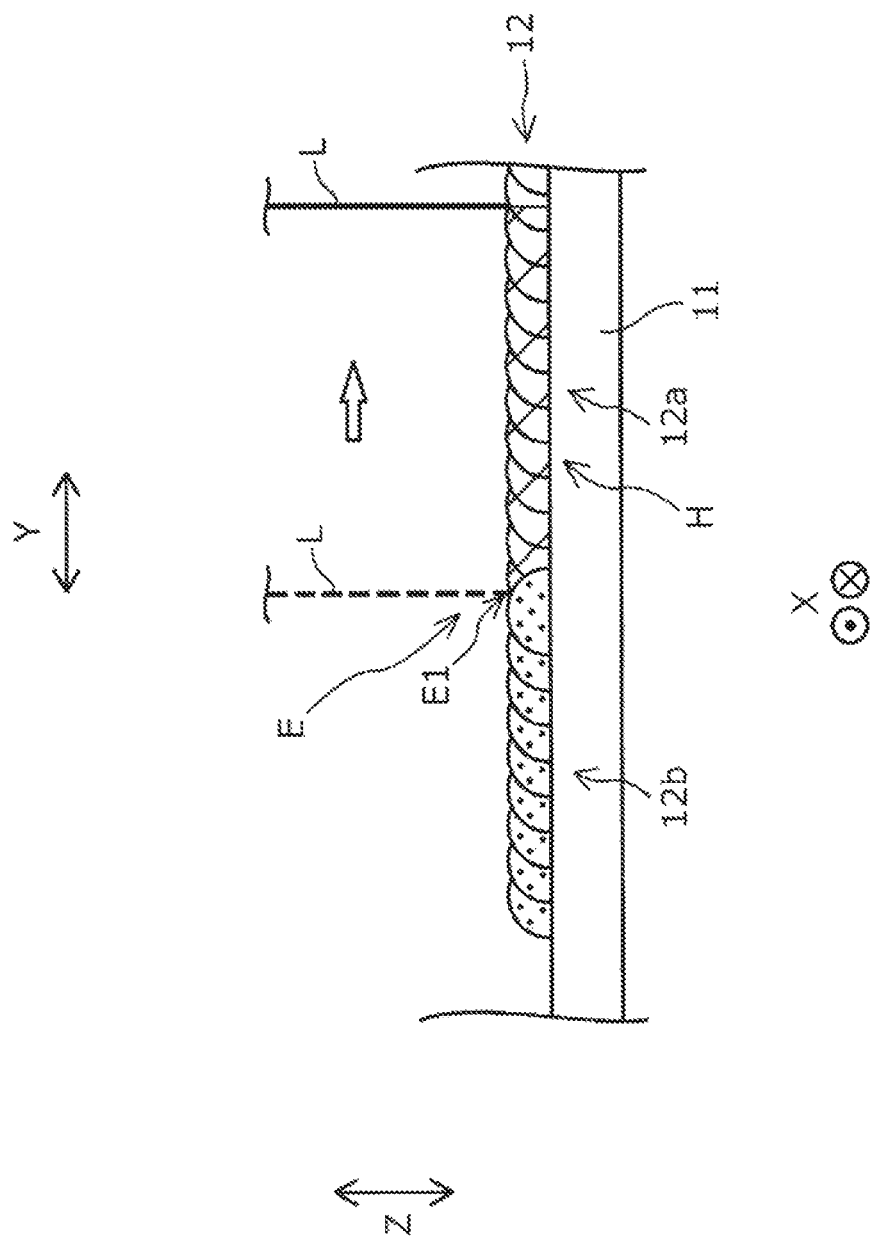
FIG. 10 is a schematic diagram for describing an example of manufacturing in a case of manufacturing a three-dimensional object using a three-dimensional object manufacturing apparatus according to an embodiment of the invention.

Next, as illustrated in FIG. 10, the laser L is radiated from the laser radiator 20 to the layer 12a constituted with the fluid material for one layer so as to solidify (melt or sinter) the stated layer 12a constituted with the fluid material for one layer, thereby forming the solidified section H (laser radiation process). At this time, the radiation position of the laser L (radiation start position) with respect to the end portion E of the layer 12a, which is constituted with the fluid material, corresponding to the end portion of the three-dimensional object O is set to a leading end E1 of the end portion E of the layer 12a constituted with the fluid material. As illustrated in FIG. 10, the vicinity of the leading end E1 of the end portion E of the layer 12a constituted with the fluid material is formed in a reverse-tapered shape. This is because a slope is formed by the support material with fluidity being extended outward more at the lower side than at the upper side due to the effect of gravity, and the end portion E of the layer 12a constituted with the fluid material is formed making use of the stated slope. By making use of the reverse-tapered shape of this portion, the reverse-tapered shape of the end portion of the three-dimensional object O can be formed with high quality.

Figure 11:
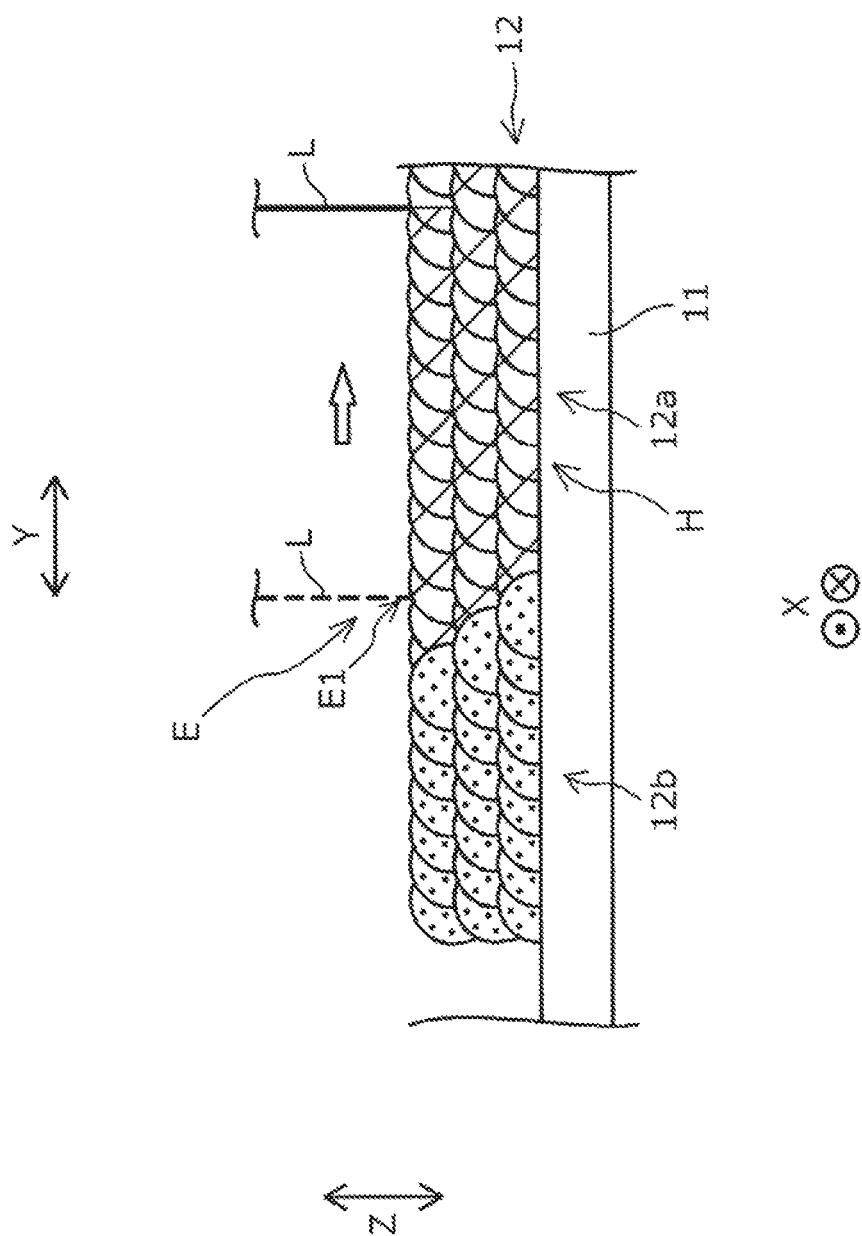
FIG. 11 is a schematic diagram for describing an example of manufacturing in a case of manufacturing a three-dimensional object using a three-dimensional object manufacturing apparatus according to an embodiment of the invention.
Figure 12:
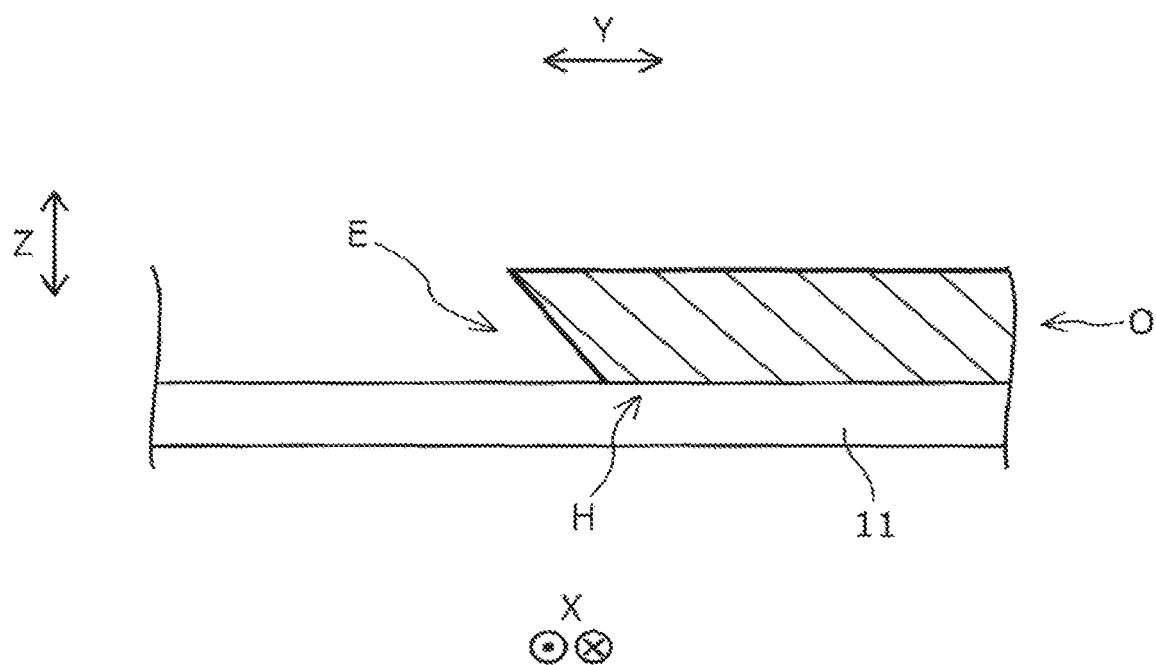
FIG. 12 is a schematic diagram for describing an example of manufacturing in a case of manufacturing a three-dimensional object using a three-dimensional object manufacturing apparatus according to an embodiment of the invention.

By repeating the layer formation process and the laser radiation process as discussed above, the layers 12 are formed in three layers as illustrated in FIG. 11. Then, a laminated body of the three-dimensional object O formed as discussed above experiences cleaning with alcohol or the like, or experiences simple blast processing, whereby the three-dimensional object O is completed as illustrated in FIG. 12. By manufacturing the three-dimensional object O in this manner, the three-dimensional object O in which the reverse-tapered shape of the end portion of the three-dimensional object O (the end portion E of the layer 12a) exhibits high quality, can be formed, as illustrated in FIG. 12.

In the case where the end portion of the three-dimensional object O to be manufactured is reverse-tapered, if the radiation position of the laser L with respect to the end portion E of the layer 12 is set to the position E2 on the inner side of the layer 12 relative to the leading end E1 in the laser radiation process, as illustrated in FIG. 3, a vertical surface is formed in each of the three layers 12. As a result, the end portion of the three-dimensional object O is stepped, thereby the three-dimensional object O being manufactured without exhibiting a high-quality reverse-tapered shape.

Next, a working example of a manufacturing method for the three-dimensional object O carried out using the manufacturing apparatus 1 for the three-dimensional object O according to the present embodiment will be described.

Figure 13:
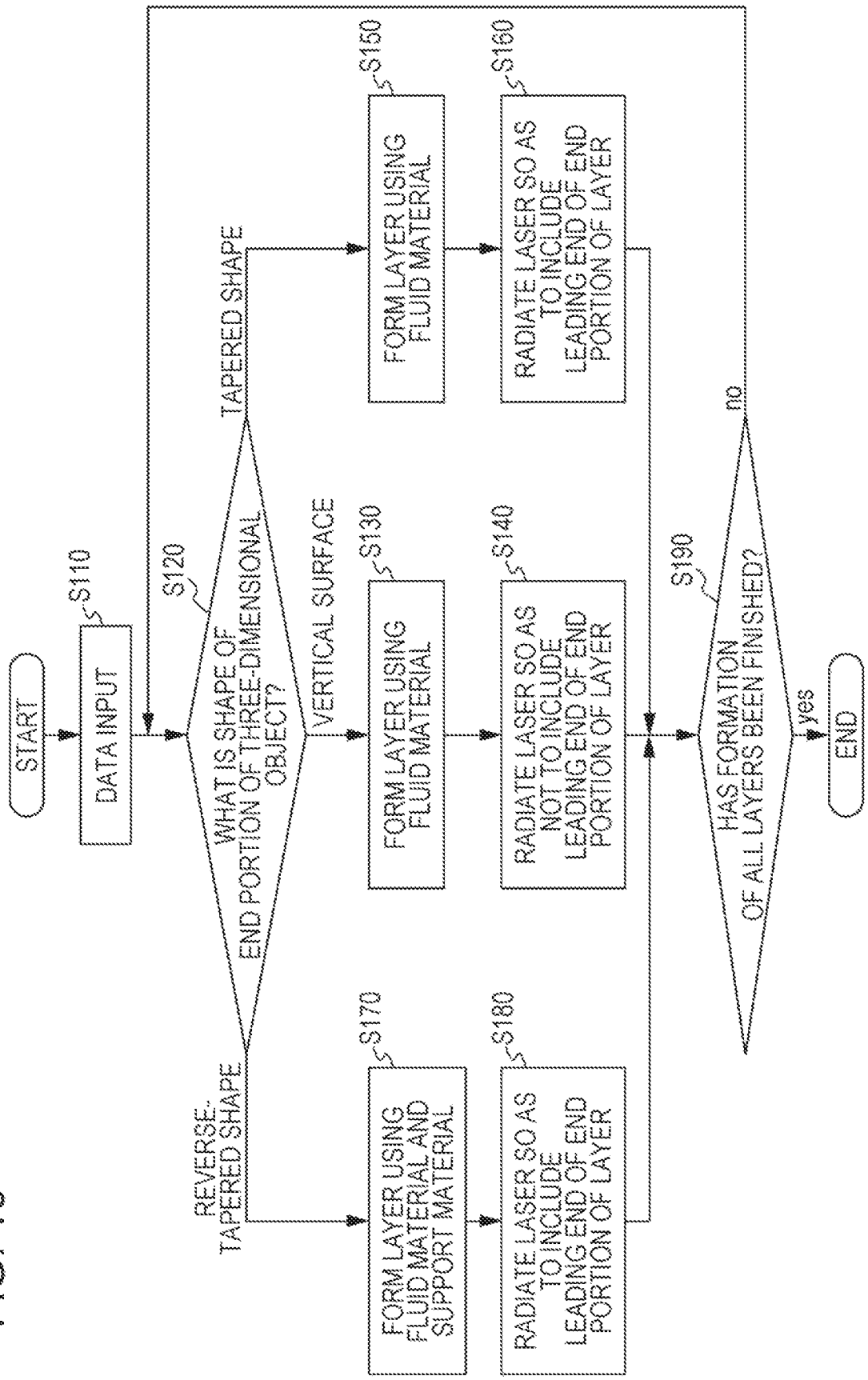
FIG. 13 is a flowchart illustrating a manufacturing method for a three-dimensional object according to a working example of the invention.

FIG. 13 is a flowchart of a manufacturing method for the three-dimensional object O carried out using the manufacturing apparatus 1 for the three-dimensional object O according to the present embodiment.

In the manufacturing method for the three-dimensional object O of the present working example, first, in Step S110, data of the three-dimensional object O is inputted from a PC 2.

Next, in Step S120, the control unit 3 determines, based on the data of the three-dimensional object O having been inputted in Step S110, whether the end portion of the three-dimensional object O is a vertical surface, a tapered shape, or a reverse-tapered shape in terms of the data for one layer.

In Step S120, in a case that the end portion of the three-dimensional object O is determined to be a vertical surface, the process flow goes to Step S130; in a case that the end portion of the three-dimensional object O is determined to be a tapered shape, the process flow goes to Step S150; and in a case that the end portion of the three-dimensional object O is determined to be a reverse-tapered shape, the process flow goes to Step S170.

In Step S130, for example, as illustrated in FIG. 2, the fluid material is ejected from the ejector 7 to form one layer of the layer 12 using the fluid material on the object platform 11 (layer formation process), and then the process flow goes to Step S140.

In Step S140, for example, as illustrated in FIG. 3, one layer of the layer 12 is solidified (melted or sintered) by the laser L being radiated from the laser radiator 20 in such a manner as not to include the leading end E1 of the end portion E of the layer 12 within a radiation range of the laser L (laser radiation process), and then the process flow goes to Step S190.

Then, in Step S190, it is determined by the control unit 3 whether or not the formation of all the layers for the three-dimensional object O has been finished. In a case where, in Step S190, it is determined that the formation of all the layers for the three-dimensional object O has been finished, the manufacturing method for the three-dimensional object O of the present working example is ended. On the other hand, in a case where, in step S190, it is determined that the formation of all the layers for the three-dimensional object O has not been finished yet, the process flow returns to Step S120 to repeat Steps from S120 through S190.

In Step S150, for example, as illustrated in FIG. 2, the fluid material is ejected from the ejector 7 to form one layer of the layer 12 using the fluid material on the object platform 11 (layer formation process), and then the process flow goes to Step S160.

In Step S160, for example, as illustrated in FIG. 6, one layer of the layer 12 is solidified (melted or sintered) by the laser L being radiated from the laser radiator 20 in such a manner as to include the leading end E1 of the end portion E of the layer 12 within the radiation range of the laser L (laser radiation process), and then the process flow goes to Step S190.

Then, in Step S190, it is determined by the control unit 3 whether or not the formation of all the layers for the three-dimensional object O has been finished. In a case where, in Step S190, it is determined that the formation of all the layers for the three-dimensional object O has been finished, the manufacturing method for the three-dimensional object O of the present working example is ended. On the other hand, in a case where, in step S190, it is determined that the formation of all the layers for the three-dimensional object O has not been finished yet, the process flow returns to Step S120 to repeat Steps from S120 through S190.

In Step S170, for example, as illustrated in FIG. 9, the fluid material and the support material are ejected from the ejector 7 to form one layer of the layer 12 using the fluid material on the object platform 11 (layer formation process), and then the process flow goes to Step S180.

In Step S180, for example, as illustrated in FIG. 10, one layer of the layer 12 (layer 12a) is solidified (melted or sintered) by the laser L being radiated from the laser radiator 20 in such a manner as to include the leading end E1 of the end portion E of the layer 12a of the fluid material within the radiation range of the laser L (laser radiation process), and then the process flow goes to Step S190.

Then, in Step S190, it is determined by the control unit 3 whether or not the formation of all the layers for the three-dimensional object O has been finished. In a case where, in Step S190, it is determined that the formation of all the layers for the three-dimensional object O has been finished, the manufacturing method for the three-dimensional object O of the present working example is ended. On the other hand, in a case where, in step S190, it is determined that the formation of all the layers for the three-dimensional object O has not been finished yet, the process flow returns to Step S120 to repeat Steps from SS20 through S190.

Here, the manufacturing method for the three-dimensional object O of the present working example will be summarized as follows.

The manufacturing method for the three-dimensional object O of the present working example includes: the layer formation process (Step S130, Step S150 and Step S170) in which the layer 12 is formed using a fluid material containing powder for constituting the three-dimensional object O, a solvent, and a binder; and the laser radiation process (Step S140, Step S160 and Step S180) in which the powder contained in the layer 12 is solidified (melted or sintered) by the layer 12 being radiated with the laser L. In Step S120, the laser radiation process controls a radiation position of the laser L in the end portion E of the layer 12 with respect to a position of the leading end E1 of the end portion E of the layer 12 in accordance with a shape of the three-dimensional object O to be manufactured.

In the case where the layer 12 is formed using the fluid material, the layer extends outward at the lower side compared to the upper side due to the effect of gravity, so that a slope is formed in the end portion E of the layer 12. Then, in the manufacturing method for the three-dimensional object O of the present working example, the layer 12 is formed using the fluid material, and the radiation position of the laser L in the end portion E of the layer 12 is controlled with respect to the position of the leading end E1 of the end portion E of the layer 12 in accordance with the shape of the three-dimensional object O to be manufactured. As such, by carrying out the manufacturing method for the three-dimensional object O of the present working example and adjusting the radiation position of the laser L, the three-dimensional object O can be manufactured while selecting a case of making use of a slope to be formed in the end portion E of the layer 12 or a case of not making use of a slope to be formed in the end portion E of the layer 12 in accordance with the shape of the three-dimensional object O to be manufactured. Accordingly, the manufacturing method for the three-dimensional object O of the present working example makes it possible to manufacture a three-dimensional object with high quality.

To rephrase, the manufacturing apparatus 1 for the three-dimensional object O according to the present embodiment includes: the ejector 7 as a layer forming unit configured to form the layer 12 using a fluid material containing powder for constituting the three-dimensional object O, a solvent, and a binder; the laser radiator 20 configured to radiate the laser L to the layer 12 so as to solidify (melt or sinter) the powder contained in the layer 12; and the control unit 3 configured to control a radiation position of the laser L in the end portion E of the layer 12 with respect to the position of the leading end E1 of the end portion E of the layer 12 in accordance with the shape of the three-dimensional object O to be manufactured.

As such, the manufacturing apparatus 1 for the three-dimensional object O of the present embodiment can manufacture the three-dimensional object while selecting a case of making use of a slope to be formed in the end portion E of the layer 12 or a case of not making use of a slope to be formed in the end portion E of the layer 12, by adjusting the radiation position of the laser L, in accordance with the shape of the three-dimensional object O to be manufactured. Accordingly, the manufacturing apparatus 1 for the three-dimensional object O of the present embodiment is configured to be capable of manufacturing a three-dimensional object O with high quality.

The laser radiation process corresponding to Step S140, in the case where the shape of the end portion E of the three-dimensional object O to be manufactured is a vertical surface, controls the laser radiation position in the end portion E of the layer 12 corresponding to the end portion of the three-dimensional object O in such a manner as not to include the leading end E1 of the end portion E of the layer 12 as discussed above. As such, the manufacturing method for the three-dimensional object O of the present working example causes the vertical surface in the end portion of the three-dimensional object O to be a surface of the end portion E of the layer 12 formed along the radiation direction of the laser L, thereby making it possible to reduce unevenness in the stated vertical surface. Accordingly, in the case where the shape of the end portion E of the three-dimensional object O to be manufactured is a vertical surface, the manufacturing method for the three-dimensional object O of the present working example can manufacture the three-dimensional object with high quality.

The laser radiation process corresponding to Step S160, in the case where the end portion of the three-dimensional object O to be manufactured is a slope extending outward in the radiation direction of the laser L (tapered shape), controls the radiation position of the laser L in the end portion E of the layer 12 corresponding to the end portion of the three-dimensional object O in such a manner as to include the leading end E1 of the end portion E of the layer 12 as discussed above. In other words, in the case where the end portion of the three-dimensional object O to be manufactured is a slope extending outward in the radiation direction of the laser L, the manufacturing method for the three-dimensional object O of the present working example can manufacture the three-dimensional object O while making use of the slope of the end portion E of the layer 12 accompanied by the formation of the layer 12 using the fluid material. Accordingly, in the case where the shape of the end portion of the three-dimensional object O to be manufactured is a slope extending outward in the radiation direction of the laser L, the manufacturing method for the three-dimensional object O of the present working example can manufacture the three-dimensional object O with high quality.

The layer formation process corresponding to Step S170 forms the layer 12 using, in addition to the fluid material, the support material with fluidity for supporting the fluid material at the end portion E of the layer 12a of the fluid material; and the laser radiation process corresponding to Step S180, in the case where the end portion of the three-dimensional object O to be manufactured is a slope extending inward in the radiation direction of the laser L (reverse-tapered shape), controls the radiation position of the laser L in the end portion E of the layer 12a of the fluid material corresponding to the end portion of the three-dimensional object O in such a manner as to include the leading end E1 of the end portion E of the layer 12a of the fluid material.

As described above, by carrying out the manufacturing method for the three-dimensional object O of the present working example, the layer can be formed while using the support material with fluidity and making use of a slope in the end portion of the stated support material with fluidity, and it is possible to form a slope of the fluid material extending inward in the radiation direction of the laser L by making use of the above slope. Then, the three-dimensional object O can be manufactured making use of the slope of the fluid material. Accordingly, in the case where the end portion of the three-dimensional object O to be manufactured is a slope extending inward in the radiation direction of the laser L, the manufacturing method for the three-dimensional object O of the present working example can manufacture the three-dimensional object O with high quality.

The above description can be rephrased as follows: in the manufacturing apparatus 1 for the three-dimensional object O of the present embodiment, the control unit 3 determines whether the end portion E of the three-dimensional object O to be manufactured is a vertical surface or a slope (Step S120). In a case where it is determined that the end portion E of the three-dimensional object O to be manufactured is a vertical surface (a case of going to Step S130), the control unit 3 controls the radiation position of the laser L in the end portion E of the layer 12 corresponding to the end portion E of the three-dimensional object O in such a manner as not to include the leading end E1 of the end portion E of the layer (Step S140). In a case where it is determined that the end portion E of the three-dimensional object O to be manufactured is a slope (a case of going to Step S150 or S170), the control unit 3 controls the radiation position of the laser L in the end portion E of the layer 12 corresponding to the end portion E of the three-dimensional object O in such a manner as to include the leading end E1 of the end portion E of the layer 12 (Step S160 or S180). Accordingly, in both the cases where the end portion E of the three-dimensional object O to be manufactured is a vertical surface and where the stated end portion is a slope, the manufacturing apparatus 1 for the three-dimensional object O of the present embodiment can manufacture the three-dimensional object O with high quality.

Further, with Step S140, Step S160, and Step S180, the manufacturing method for the three-dimensional object O of the present working example can manufacture the three-dimensional object by laminating the layers 12, by repeating the layer formation process and the laser radiation process. As such, by carrying out the manufacturing method for the three-dimensional object O of the present working example, it is possible to manufacture the three-dimensional object O large in size and excellent in quality, by laminating the layers 12.

As discussed above, the ejector 7 of the present working example is configured to be capable of ejecting (discharging) the fluid material in a droplet state.

To rephrase, in the manufacturing method for the three-dimensional object O of the present working example, the layer formation process forms the layer 12 by discharging the fluid material in a droplet state.

With this, the manufacturing method for the three-dimensional object O of the present working example can precisely form the layer 12 for forming the three-dimensional object O.

Note that, however, the manufacturing method is not limited to the configuration capable of ejecting (discharging) the fluid material in a droplet state, and a configuration in which the fluid material can be continuously ejected may be employed, for example.

Moreover, the manufacturing apparatus 1 for the three-dimensional object O according to the present embodiment is configured such that the precision in the radiation position of the laser L is higher than the precision in the arrangement position of the droplet discharged from the ejector 7. Because of this, by carrying out the manufacturing method for the three-dimensional object O of the present working example while using the manufacturing apparatus 1 for the three-dimensional object O of the present embodiment, the three-dimensional object O can be precisely solidified, and consequently the three-dimensional object O with high quality can be manufactured.

Further, in the manufacturing method for the three-dimensional object O of the present working example, in the case where the end portion of the three-dimensional object O to be manufactured is a vertical surface, the end portion of the three-dimensional object O is caused to correspond to the end portion E of each of the layers 12 prepared in the layer formation process, and the arrangement position of the fluid material in the end portion E of each of the layers 12 corresponding to the end portion of the three-dimensional object O is aligned in each layer formation process (see FIG. 4). This makes it possible for an excessive fluid material to retreat from the end portion E of the layer 12 toward the outside of the layer 12 in each layer formation process, and consequently makes it possible to suppress a situation in which a projection or the like is generated in the end portion of the three-dimensional object O (a problem of a decrease in quality of the three-dimensional object O).

Details of this will be described below with reference to FIG. 2, FIG. 3, and FIGS. 14 to 24.

Figure 14:
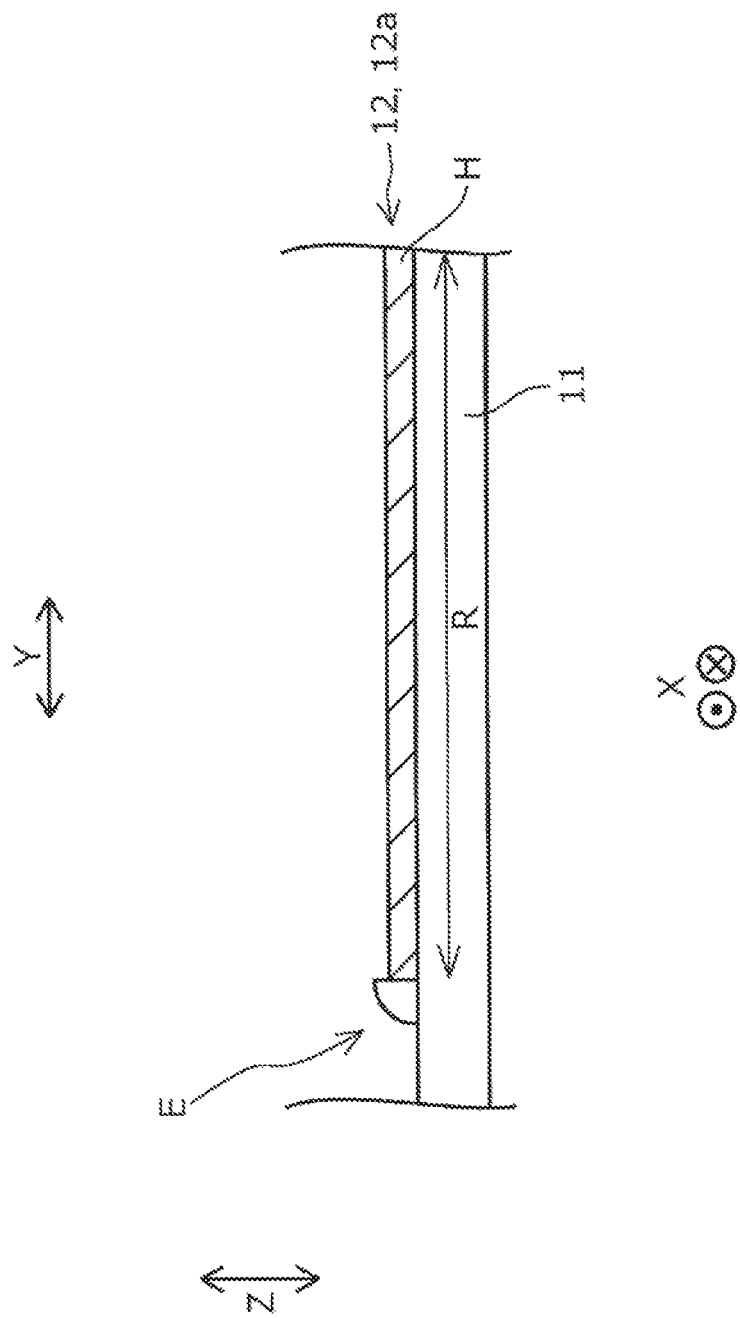
FIG. 14 is a schematic diagram for describing an example of manufacturing in a case of manufacturing a three-dimensional object using a three-dimensional object manufacturing apparatus according to an embodiment of the invention.

In the manufacturing method for the three-dimensional object O of the present working example, in the case where the end portion of the three-dimensional object O to be manufactured is a vertical surface, the fluid material of the first layer is disposed first in the layer formation process so that the end portion of the three-dimensional object O corresponds to the end portion E of the layer 12, as illustrated in FIG. 2. Then, after the fluid material is disposed as illustrated in FIG. 2, when the laser radiation process is performed on a laser radiation range R, the solidified section H is formed as illustrated in FIG. 3. However, with the solidification (melting or sintering) by the laser radiation, the solidified section H shrinks as illustrated in FIG. 14.

Figure 15:
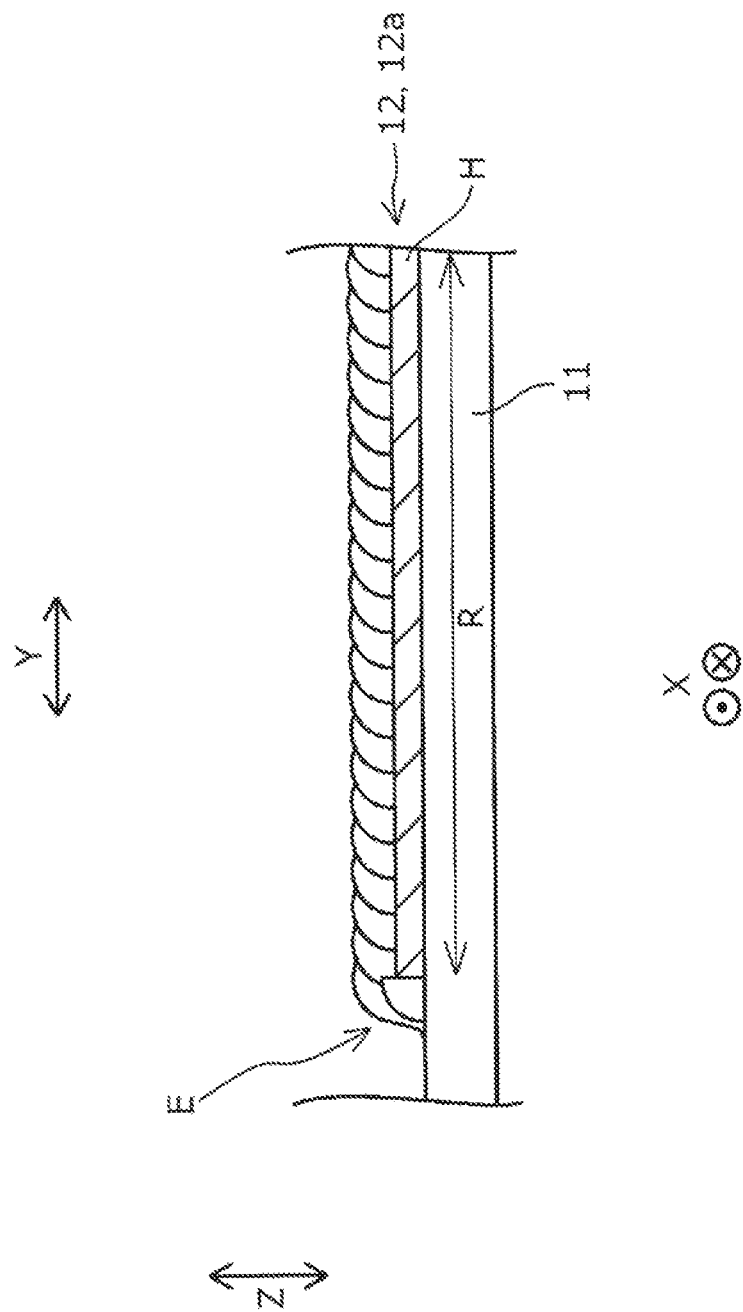
FIG. 15 is a schematic diagram for describing an example of manufacturing in a case of manufacturing a three-dimensional object using a three-dimensional object manufacturing apparatus according to an embodiment of the invention.
Figure 16:
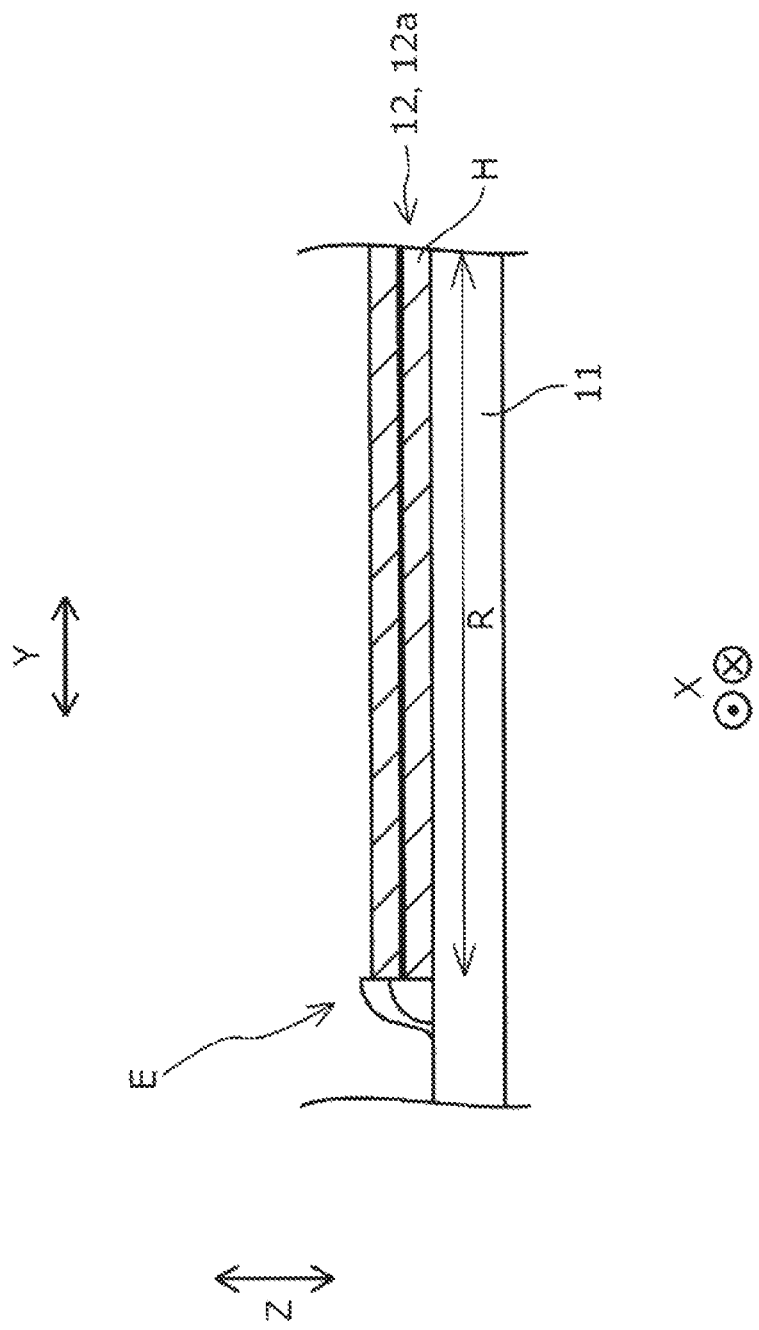
FIG. 16 is a schematic diagram for describing an example of manufacturing in a case of manufacturing a three-dimensional object using a three-dimensional object manufacturing apparatus according to an embodiment of the invention.

Thereafter, as illustrated in FIG. 15, when the layer formation process for the second layer is performed, because the arrangement position of the fluid material in the end portion E of the layer 12 in the layer formation process for the first layer and the arrangement position of the fluid material in the end portion E of the layer 12 in the layer formation process for the second layer are aligned, part of the fluid material in the end portion E flows toward the outside due to the effect of gravity. Due to this, as illustrated in FIG. 15, the height of the layer 12 of the second layer is leveled as a whole. Then, after having disposed the fluid material as illustrated in FIG. 15, when the laser radiation process is performed on the laser radiation range R, the solidified section H is formed corresponding to the two layers with the height thereof being leveled as a whole, as illustrated in FIG. 16.

Figure 17:
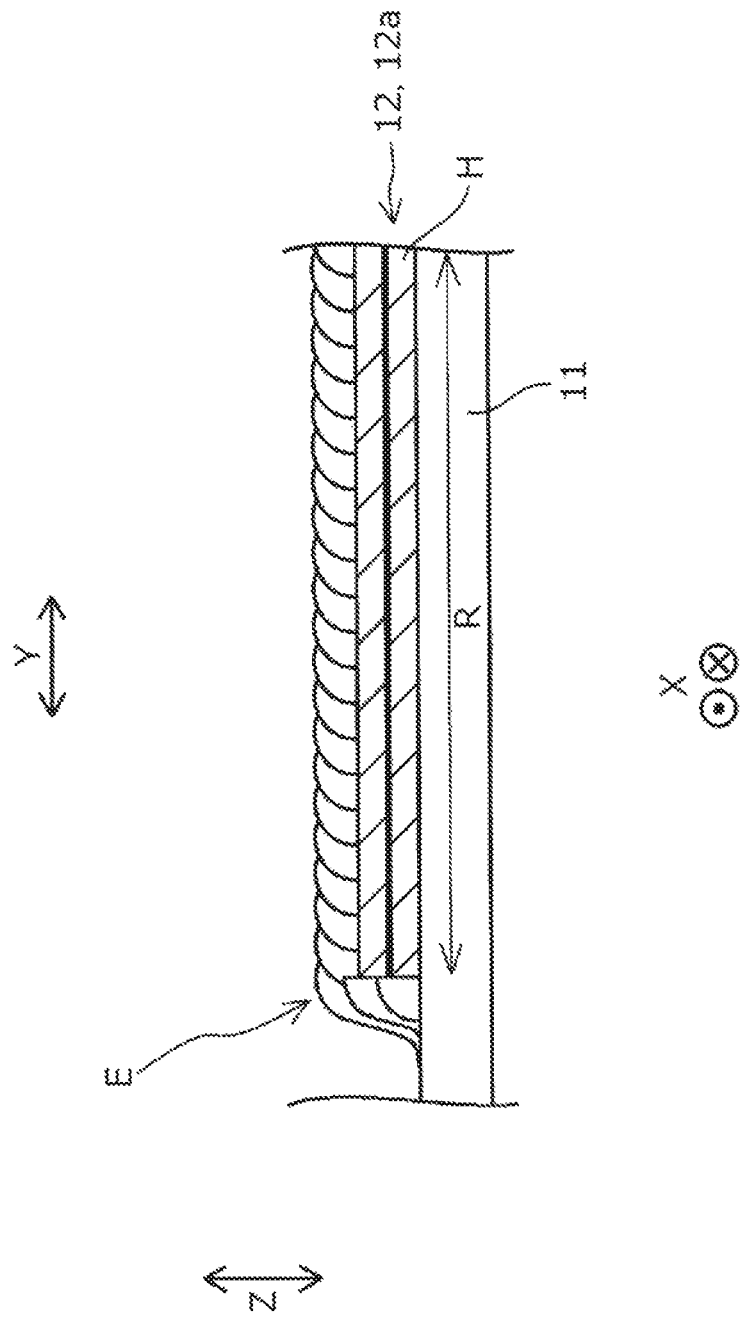
FIG. 17 is a schematic diagram for describing an example of manufacturing in a case of manufacturing a three-dimensional object using a three-dimensional object manufacturing apparatus according to an embodiment of the invention.
Figure 18:
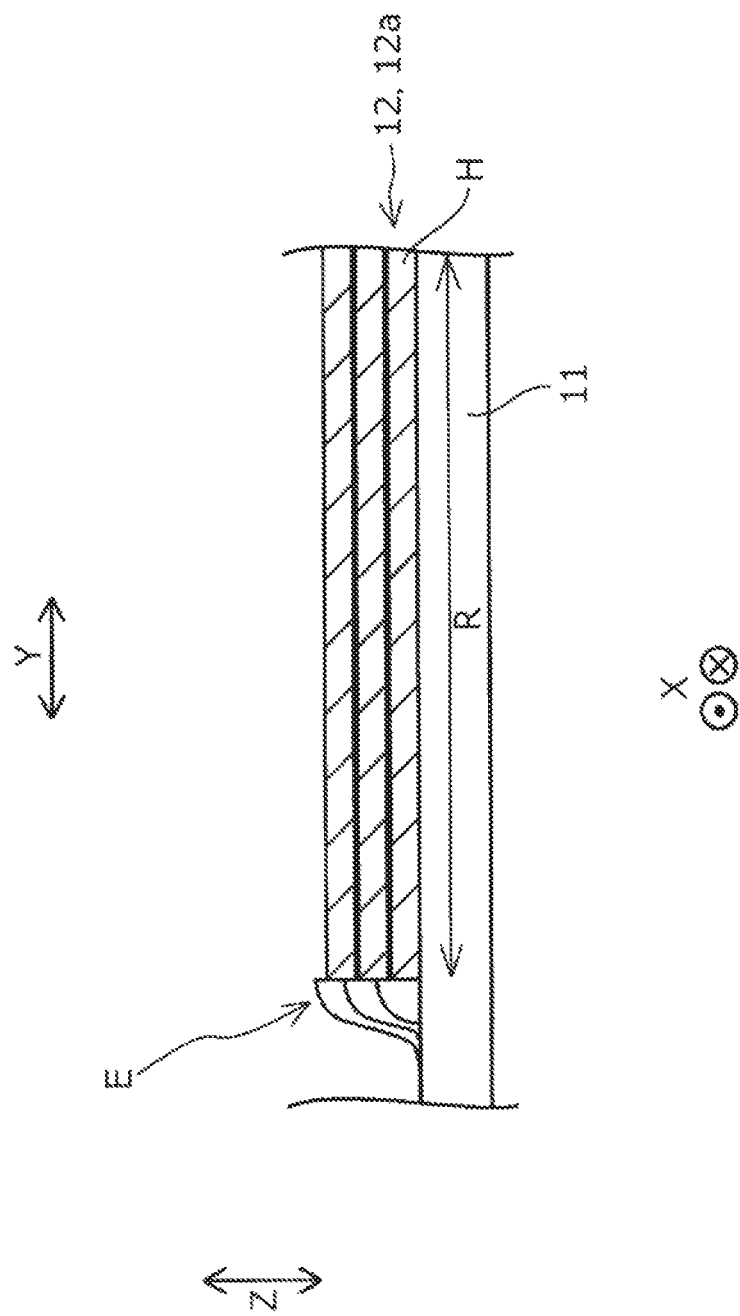
FIG. 18 is a schematic diagram for describing an example of manufacturing in a case of manufacturing a three-dimensional object using a three-dimensional object manufacturing apparatus according to an embodiment of the invention.

Further thereafter, as illustrated in FIG. 17, when the layer formation process for the third layer is performed, because the arrangement position of the fluid material in the end portion E of the layer 12 in the layer formation process for the first layer, the arrangement position of the fluid material in the end portion E of the layer 12 in the layer formation process for the second layer, and the arrangement position of the fluid material in the end portion E of the layer 12 in the layer formation process for the third layer are aligned, part of the fluid material in the end portion E flows toward the outside due to the effect of gravity. Due to this, as illustrated in FIG. 17, the height of the layer 12 of the third layer is leveled as a whole. Then, after having disposed the fluid material as illustrated in FIG. 17, when the laser radiation process is performed on the laser radiation range R, the solidified section H is formed corresponding to the three layers with the height thereof being leveled as a whole, as illustrated in FIG. 18.

As discussed above, in the case where the shape of the end portion of the three-dimensional object O to be manufactured is a vertical surface, the end portion of the three-dimensional object O is caused to correspond to the end portion E of each of the layers 12 prepared in each layer formation process, and the arrangement position of the fluid material in the end portion E of each of the layers 12 corresponding to the end portion of the three-dimensional object O is aligned in each layer formation process, thereby making it possible to suppress a decrease in quality of the three-dimensional object O.

Next, an example of manufacturing the three-dimensional object O will be described in a case where the shape of the end portion of the three-dimensional object O to be manufactured is a vertical surface, and the fluid material is not disposed so that the end portion of the three-dimensional object O corresponds to the end portion E of each of the layers 12 in the layer formation process.

Figure 19:
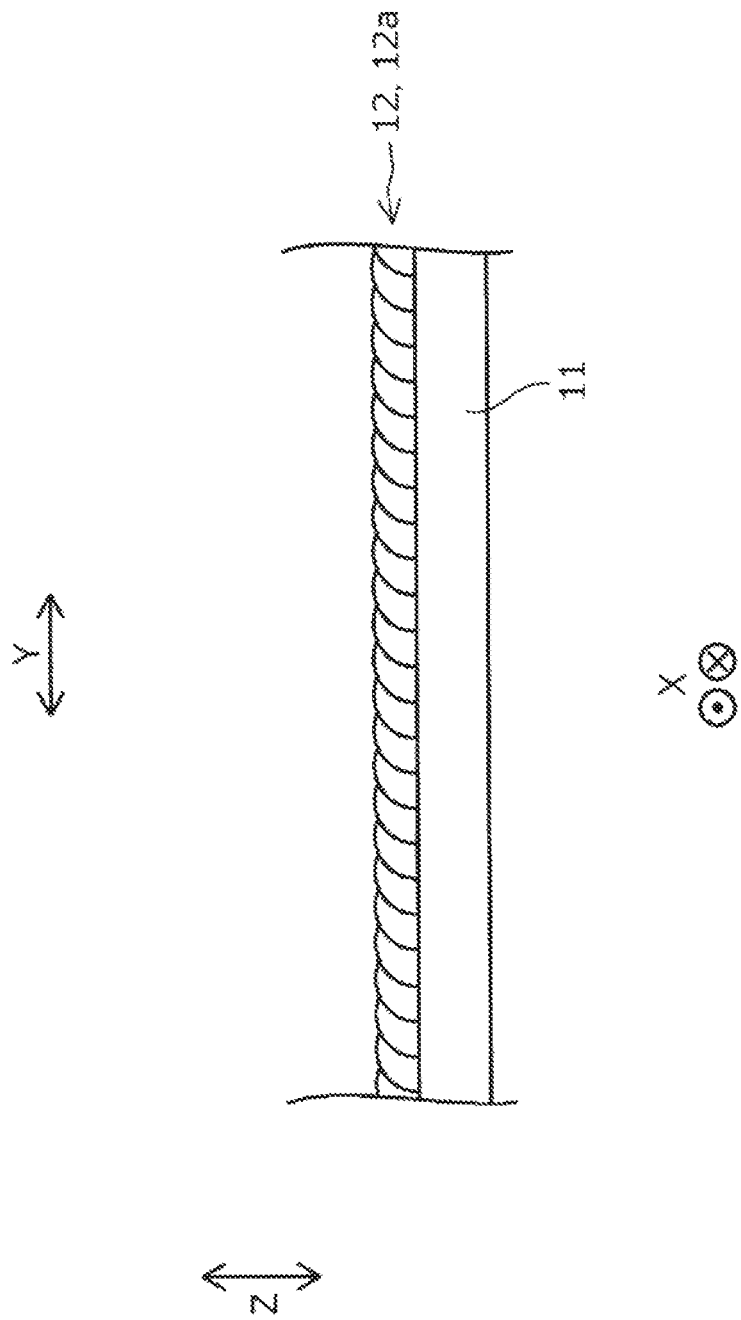
FIG. 19 is a schematic diagram for describing an example of manufacturing in a case of manufacturing a three-dimensional object using a three-dimensional object manufacturing apparatus according to an embodiment of the invention.
Figure 20:
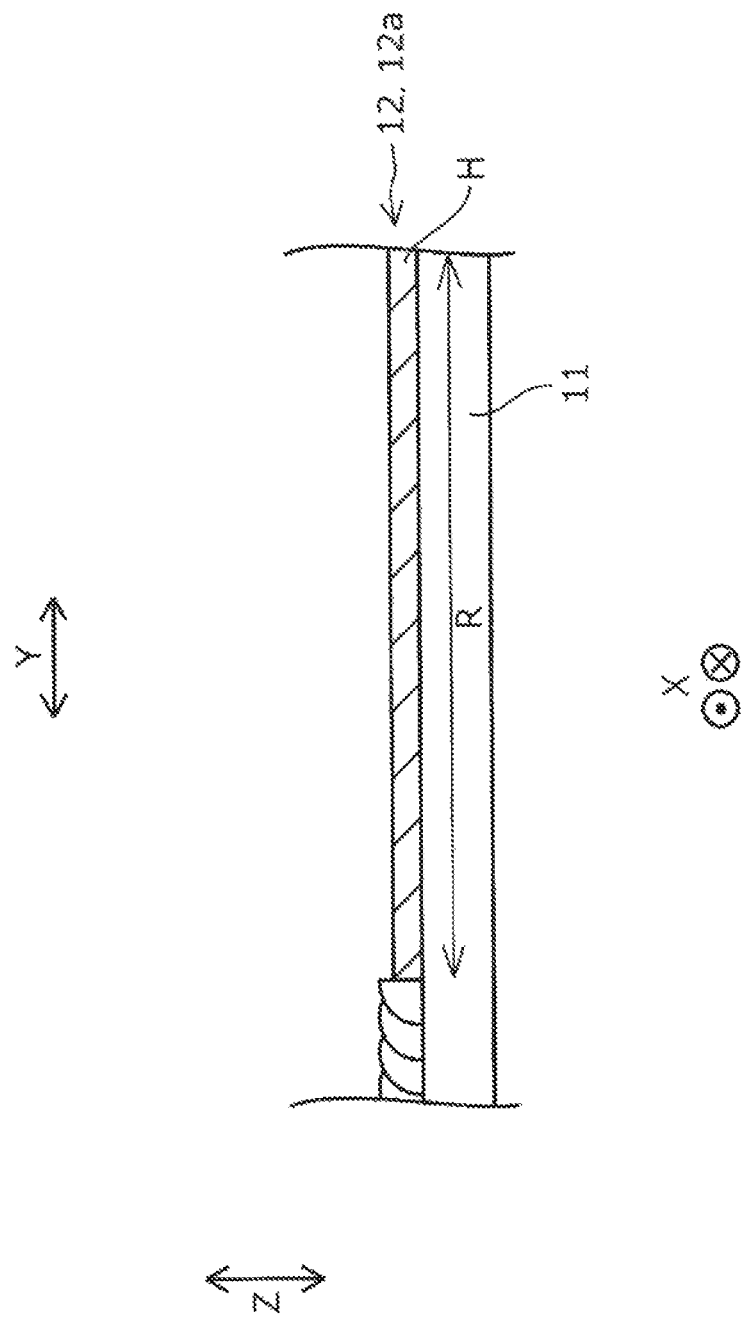
FIG. 20 is a schematic diagram for describing an example of manufacturing in a case of manufacturing a three-dimensional object using a three-dimensional object manufacturing apparatus according to an embodiment of the invention.

First, as illustrated in FIG. 19, the fluid material of the first layer is disposed in such a manner that the end portion of the three-dimensional object O does not correspond to the end portion E of each of the layers 12 in the layer formation process. Then, after the fluid material is disposed as illustrated in FIG. 19, when the laser radiation process is performed on the laser radiation range R, the solidified section H is formed as illustrated in FIG. 20. However, with the solidification (melting or sintering) by the laser radiation, the solidified section H shrinks as illustrated in FIG. 20.

Figure 21:
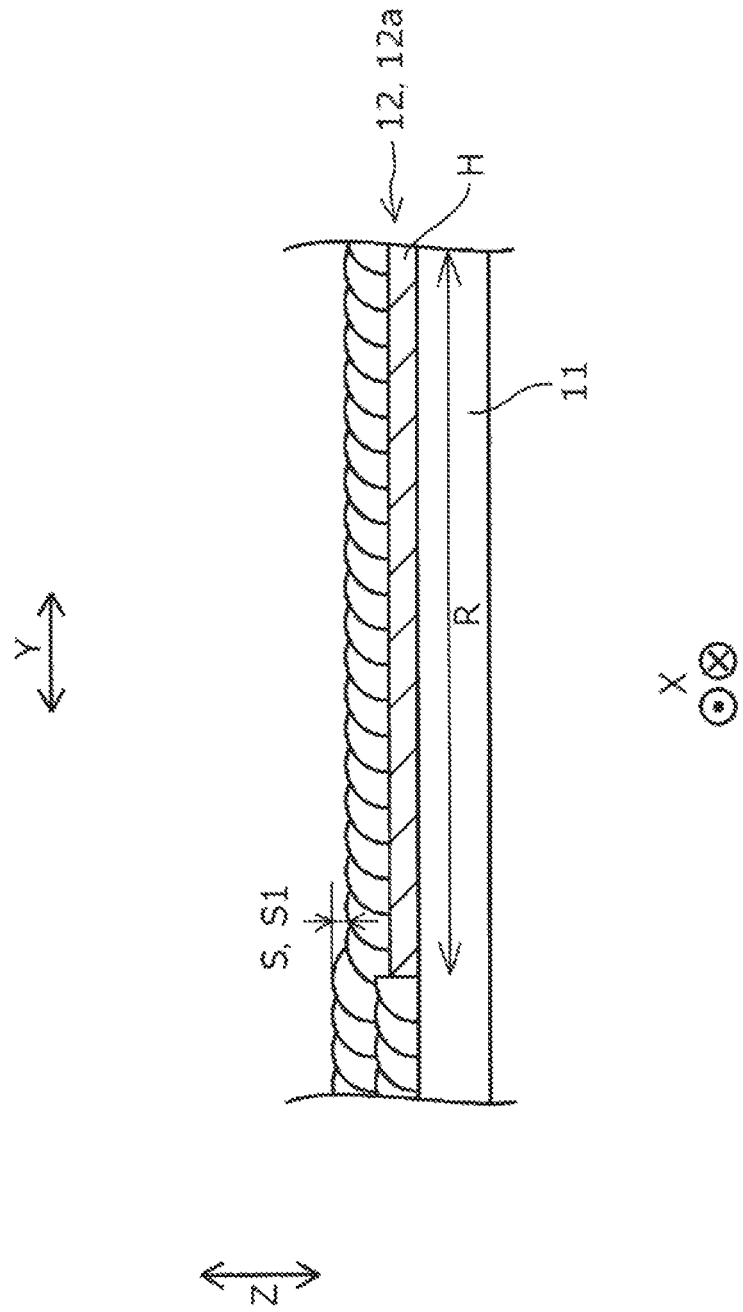
FIG. 21 is a schematic diagram for describing an example of manufacturing in a case of manufacturing a three-dimensional object using a three-dimensional object manufacturing apparatus according to an embodiment of the invention.
Figure 22:
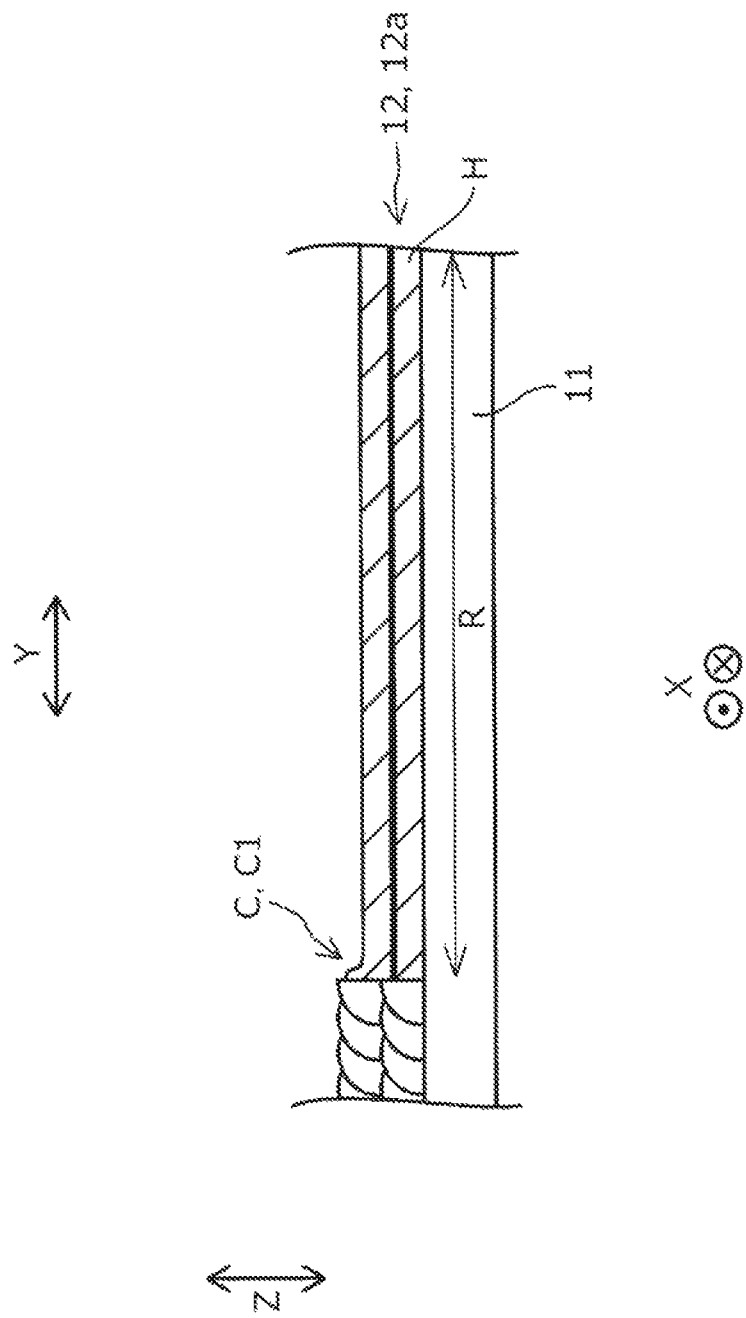
FIG. 22 is a schematic diagram for describing an example of manufacturing in a case of manufacturing a three-dimensional object using a three-dimensional object manufacturing apparatus according to an embodiment of the invention.

Thereafter, as illustrated in FIG. 21, when the layer formation process for the second layer is performed, a step S (step S1) is generated in the second layer of the layer 12 due to a difference in height between a solidified area (an area where the solidified section H is formed) and a not-solidified area (an area where the solidified section H is not formed) of the first layer of the layer 12. Then, after having disposed the fluid material as illustrated in FIG. 21, and the laser radiation process is performed on the laser radiation range R, the solidified section H is formed corresponding to the two layers where a projected portion C (projected portion C1) is formed in the end portion thereof due to the step S (step S1), as illustrated in FIG. 22.

Figure 23:
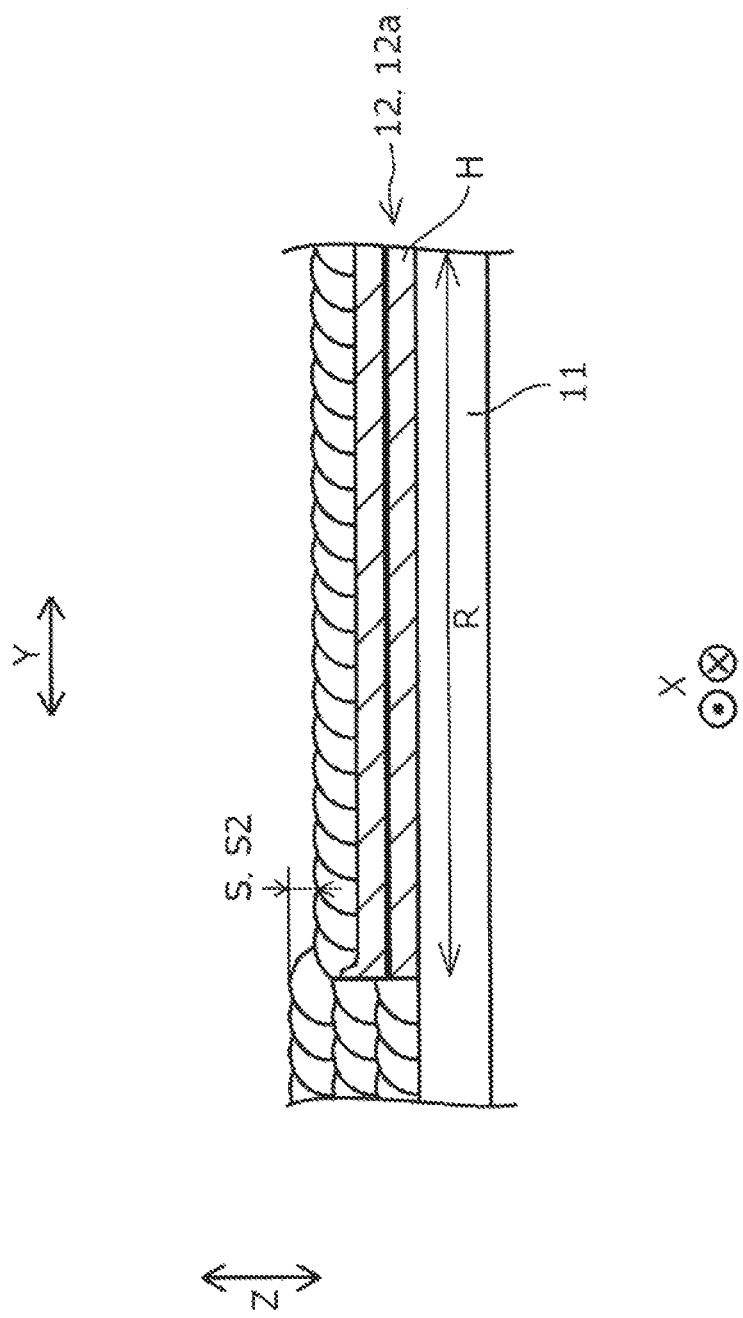
FIG. 23 is a schematic diagram for describing an example of manufacturing in a case of manufacturing a three-dimensional object using a three-dimensional object manufacturing apparatus according to an embodiment of the invention.

Thereafter, as illustrated in FIG. 23, when the layer formation process for the third layer is performed, a step S2 larger than the step S1 is generated in the third layer of the layer 12 due to a difference in height between a solidified area and a not-solidified area of the two layers of the layers 12. Then, after having disposed the fluid material as illustrated in FIG. 23, when the laser radiation process is performed on the laser radiation range R, the solidified section H is formed corresponding to the three layers where a projected portion C (projected portion C2) is formed in the end portion thereof due to the step S (step S2), as illustrated in FIG. 24.

Here, the height of the projected portion C2 is larger than that of the projected portion C1. That is, by repeating the method illustrated in FIGS. 19 to 24 to further increase the number of laminated layers, the height of the projected portion C becomes larger.

In a case that the three-dimensional object O with a small number of laminated layers is manufactured, even if the projected portion C is formed in the end portion, the quality of the object is not largely affected by that in most cases. However, in a case that the three-dimensional object O with a large number of laminated layers is manufactured, the projected portion C is noticeable in some cases. Accordingly, at the time of manufacturing the three-dimensional object O with a large number of laminated layers, it is preferable to carry out the manufacturing method for the three-dimensional object O of the present working example (the method is such that, in the case where the end portion of the three-dimensional object O to be manufactured is a vertical surface, the end portion of the three-dimensional object O is caused to correspond to the end portion E of each of the layers 12 prepared in the layer formation process, and the arrangement position of the fluid material in the end portion E of each of the layers 12 corresponding to the end portion of the three-dimensional object O is aligned in each layer formation process).

The invention is not limited to the above working example, and can be implemented in various configurations within a range not departing from the spirit and scope of the invention. For example, the technical features in the working example corresponding to the technical features in the aspects described in the section of SUMMARY can be appropriately replaced, combined, or the like with each other in order to solve part of or all of the aforementioned problems, or to obtain part of or all of the aforementioned effects. Further, the stated technical features can appropriately be deleted unless they are described as being absolutely necessary in this specification.

What is claimed is:

1. A manufacturing method for a three-dimensional object, the method comprising:
    a layer formation process of depositing a fluid material on a base to form one layer of a plurality of layers, the fluid material containing powder for constituting a three-dimensional object, a solvent, and a binder; and
    a laser radiation process of radiating a laser to the formed one layer and solidifying the powder by the laser, the laser radiation process being conducted after the layer formation process of forming an entirety of the one layer is completed,
    wherein, in the laser radiation process, a radiation position of the laser in an end portion of the one layer is controlled with respect to an edge of the end portion of the one layer in accordance with a shape of the three-dimensional object.

2. The manufacturing method for the three-dimensional object according to claim 1,
    wherein, when a shape of an end portion of the three-dimensional object is a vertical surface, the radiation position of the laser in the end portion of the one layer corresponding to the end portion of the three-dimensional object does not include the edge of the end portion of the one layer.

3. The manufacturing method for the three-dimensional object according to claim 1,
wherein, when a shape of an end portion of the three-dimensional object is a slope extending outward in a laser radiation direction, the radiation position of the laser in the end portion of the one layer corresponding to the end portion of the three-dimensional object includes the edge of the end portion of the one layer.

4. The manufacturing method for the three-dimensional object according to claim 1,
wherein the layer formation process forms the one layer using, in addition to the fluid material, a support material with fluidity for supporting the fluid material at an end portion of the one layer of the fluid material, and
when the shape of an end portion of the three-dimensional object is a slope extending inward in a laser radiation direction, the radiation position of the laser in the end portion of the one layer of the fluid material corresponding to the end portion of the three-dimensional object includes the edge of the end portion of the one layer of the fluid material.

5. The manufacturing method for the three-dimensional object according to claim 1,
wherein in the layer formation process, the fluid material is discharged as droplets to form the one layer.

6. The manufacturing method for the three-dimensional object according to claim 5,
wherein precision in the radiation position of the laser is higher than precision of an arrangement position of the droplets of the fluid material.

7. The manufacturing method for the three-dimensional object according to claim 1,
wherein the three-dimensional object is manufactured by laminating the layers, by repeating the layer formation process and the laser radiation process.

8. The manufacturing method for the three-dimensional object according to claim 7,
wherein, when an end portion of the three-dimensional object is a vertical surface, the end portion of the three-dimensional object corresponds to an end portion of each of the layers prepared in the repeated layer formation processes, and an arrangement position of the fluid material in the end portion of each of the layers corresponding to the end portion of the three-dimensional object is aligned in each of the repeated layer formation processes.

9. A manufacturing apparatus for a three-dimensional object, the apparatus comprising:
a layer forming unit configured to deposit a fluid material on a base to form a layer, the fluid material containing powder for constituting a three-dimensional object, a solvent, and a binder;
a laser radiator configured to radiate a laser to the layer so as to solidify the powder contained in the layer; and
a control unit configured to control the layer forming unit and the laser radiator,
wherein the control unit is configured to cause the laser radiator to radiate the laser to the layer after the control unit determines that an entirety of the layer has been formed on the base by the layer forming unit, and
the control unit is configured to control a radiation position of the laser in an end portion of the layer with respect to an edge of the end portion of the layer in accordance with a shape of the three-dimensional object.

10. The manufacturing apparatus for the three-dimensional object according to claim 9,
wherein the control unit is configured to determine whether an end portion of the three-dimensional object is a vertical surface or a slope,
when the control unit determines that the end portion of the three-dimensional object is the vertical surface, the control unit controls the radiation position of the laser in the end portion of the layer corresponding to the end portion of the three-dimensional object to not include the edge of the end portion of the layer, and
when the control unit determines that the end portion of the three-dimensional object is the slope, the control unit controls the radiation position of the laser in the end portion of the layer corresponding to the end portion of the three-dimensional object to include the edge of the end portion of the layer.

* * * * *